(12) United States Patent
Kitano et al.

(10) Patent No.: US 8,266,335 B2
(45) Date of Patent: Sep. 11, 2012

(54) VIDEO DISPLAY DEVICE, METHOD OF DISPLAYING CONNECTORS, TRANSMISSION-LINE STATE DETECTION DEVICE, TRANSMISSION LINE-STATE DETECTION METHOD AND SEMICONDUCTOR INTEGRATED CIRCUIT

(75) Inventors: Masaki Kitano, Tokyo (JP); Hidekazu Kikuchi, Kanagawa (JP)

(73) Assignee: Sony Corporation (JP)

( * ) Notice: Subject to any disclaimer, the term of this patent is extended or adjusted under 35 U.S.C. 154(b) by 260 days.

(21) Appl. No.: 12/586,022

(22) Filed: Sep. 16, 2009

(65) Prior Publication Data

US 2010/0073560 A1    Mar. 25, 2010

(30) Foreign Application Priority Data

Sep. 19, 2008 (JP) ................ P2008-241514

(51) Int. Cl.
G06F 3/00 (2006.01)
(52) U.S. Cl. ............... 710/15; 710/17; 710/19
(58) Field of Classification Search .......... None
See application file for complete search history.

(56) References Cited

U.S. PATENT DOCUMENTS

| 5,949,236 | A * | 9/1999 | Franchville ............... 324/533 |
| 7,394,499 | B2 | 7/2008 | Okamoto et al. |
| 2002/0089335 | A1 | 7/2002 | Williams |
| 2003/0182089 | A1 * | 9/2003 | Rubbers .................. 702/191 |
| 2004/0230385 | A1 * | 11/2004 | Bechhoefer et al. ....... 702/57 |
| 2004/0251913 | A1 | 12/2004 | Pharn et al. |
| 2006/0181283 | A1 * | 8/2006 | Wajcer et al. ............. 324/539 |
| 2007/0004270 | A1 * | 1/2007 | Kim et al. ................ 439/497 |
| 2007/0264862 | A1 | 11/2007 | Hallberg |
| 2008/0123771 | A1 * | 5/2008 | Cranford et al. ......... 375/285 |
| 2008/0186078 | A1 * | 8/2008 | Shintani et al. .......... 327/365 |

FOREIGN PATENT DOCUMENTS

| JP | 58082324 A | 5/1983 |
| JP | 62136978 A | 6/1987 |
| JP | 62159260 A | 7/1987 |
| JP | 02124126 A | 5/1990 |
| JP | 4123775 A | 4/1992 |
| JP | 05277063 A | 10/1993 |
| JP | 2001103440 A | 4/2001 |
| JP | 2007-134956 A | 5/2007 |

(Continued)

OTHER PUBLICATIONS

European Search Report, EP 09170485, dated Dec. 11, 2009.
European Search Report, EP 09170485, dated Mar. 24, 2010.

(Continued)

*Primary Examiner* — Henry Tsai
*Assistant Examiner* — Kris Rhu
(74) *Attorney, Agent, or Firm* — Lerner, David, Littenberg, Krumholz & Mentlik, LLP

(57) ABSTRACT

A video display device includes: connectors to which cables transmitting video signals are connected; a display panel displaying video by the video signal inputted to the connector from an external device through the cable; a display control unit displaying connector indications indicating the connectors on the display panel; a cable detection unit outputting a step waveform signal to the connector and detecting connection/disconnection of the cable to the connector based on a reflected signal of the step waveform signal, and wherein the display control unit changes the appearance of the connector indications displayed on the display panel according to a detection output of the cable detection unit.

18 Claims, 29 Drawing Sheets

FOREIGN PATENT DOCUMENTS

| | | | |
|---|---|---|---|
| JP | 2007225980 | A | 9/2007 |
| JP | 2007271374 | A | 10/2007 |
| JP | 2008-067284 | A | 3/2008 |
| WO | WO-02-078336 | A1 | 10/2002 |

OTHER PUBLICATIONS

Office Action from Japanese Application No. 2008-241514, dated Sep. 14, 2010.

* cited by examiner

FIG.5

HDMI PIN ARRANGEMENT (IN THE CASE OF TYPE-A)

| PIN | Signal Assignment |
|---|---|
| 1 | TMDS Data2+ |
| 3 | TMDS Data2− |
| 5 | TMDS Data1 Shield |
| 7 | TMDS Data0+ |
| 9 | TMDS Data0− |
| 11 | TMDS Clock Shield |
| 13 | CEC |
| 15 | SCL |
| 17 | DDC/CEC Ground |
| 19 | Hot Plug Detect |

| PIN | Signal Assignment |
|---|---|
| 2 | TMDS Data2 Shield |
| 4 | TMDS Data1+ |
| 6 | TMDS Data1− |
| 8 | TMDS Data0 Shield |
| 10 | TMDS Clock+ |
| 12 | TMDS Clock− |
| 14 | Reserved (N.C. on device) |
| 16 | SDA |
| 18 | +5V Power |

PROCESSING OF DETERMINING CONNECTION/
DISCONNECTION OF CABLE IN CONTROL UNIT

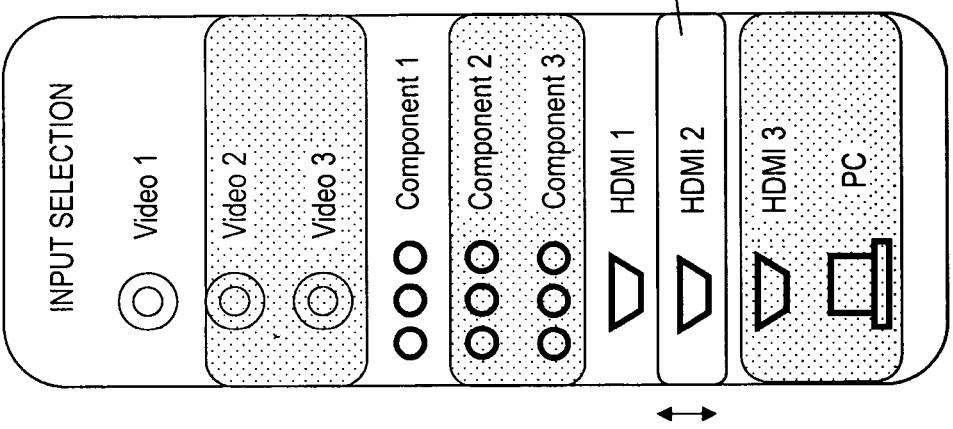
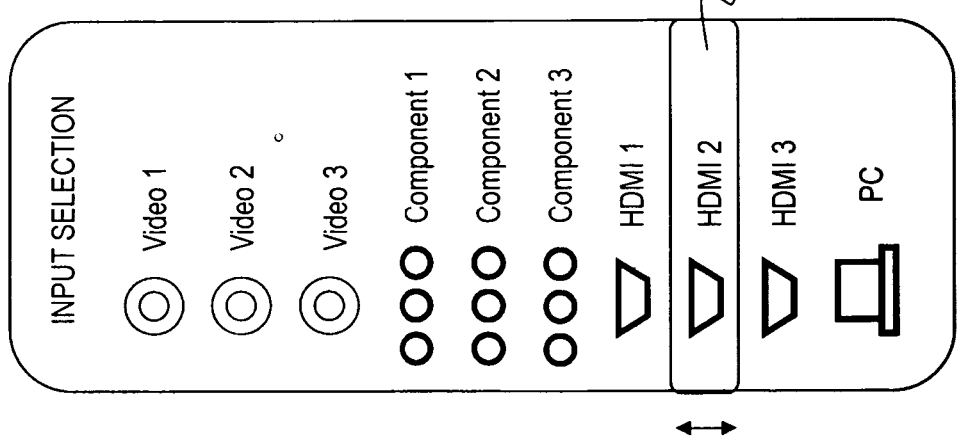

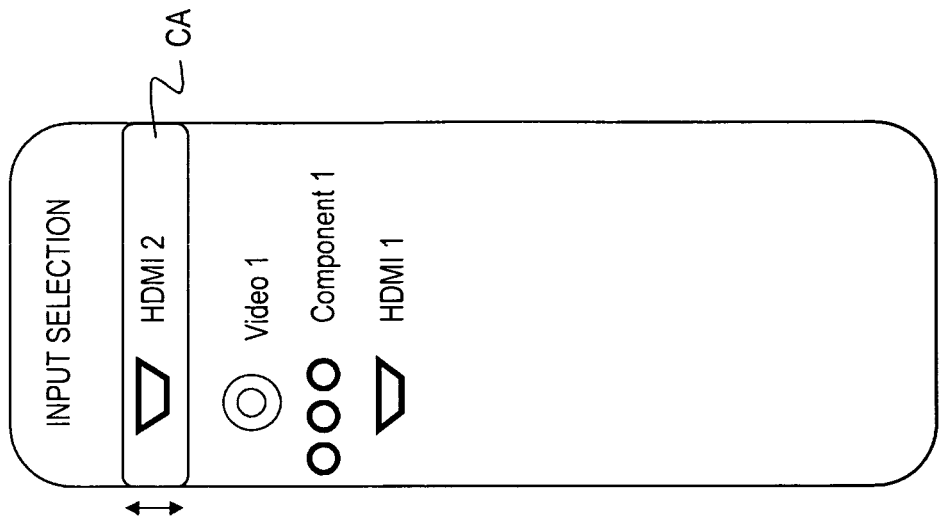
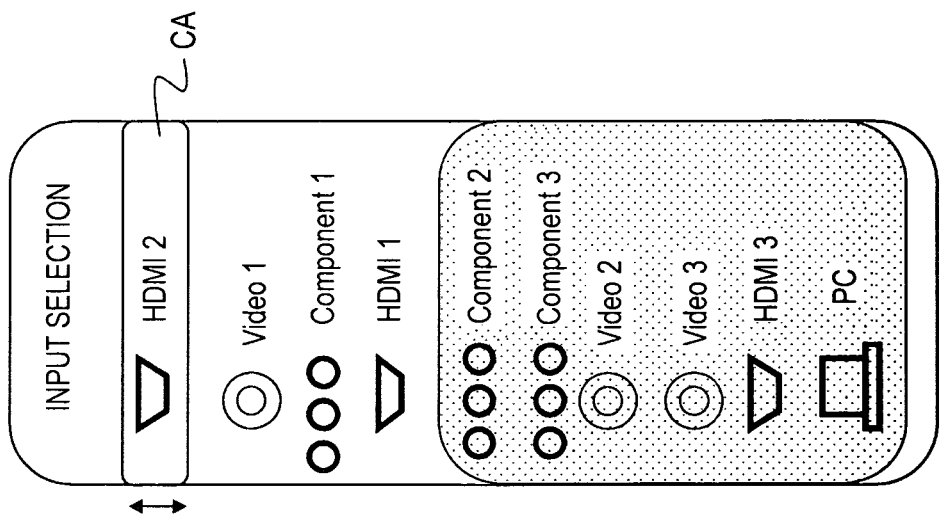

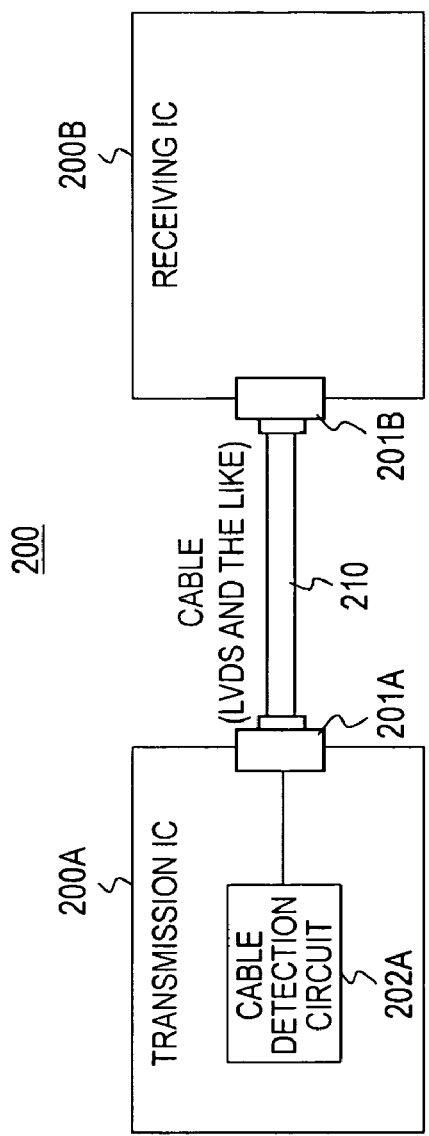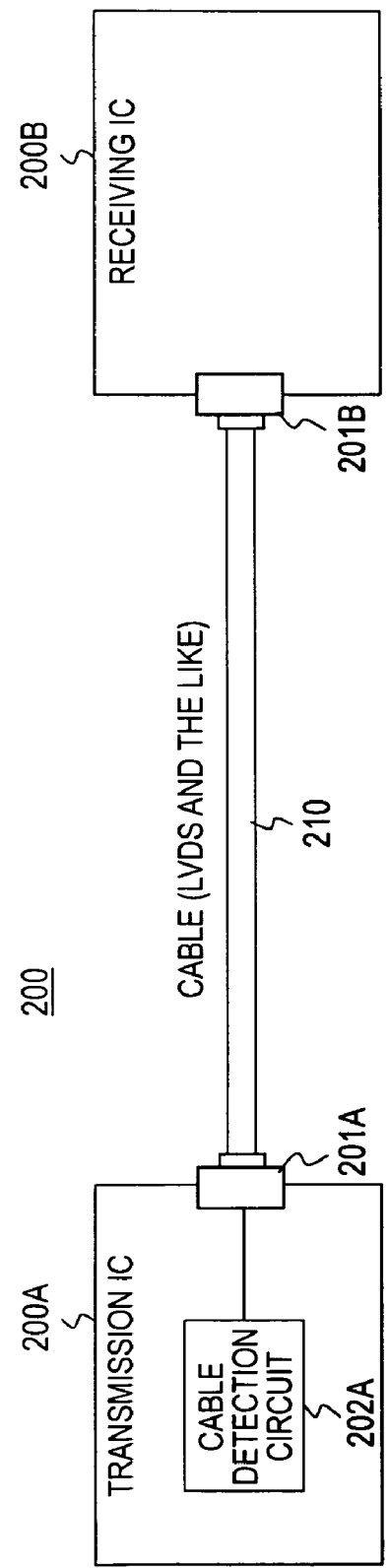

VIDEO DISPLAY DEVICE, METHOD OF DISPLAYING CONNECTORS, TRANSMISSION-LINE STATE DETECTION DEVICE, TRANSMISSION LINE-STATE DETECTION METHOD AND SEMICONDUCTOR INTEGRATED CIRCUIT

CROSS-REFERENCE TO RELATED APPLICATION

The present application claims priority from Japanese Patent Application No. JP 2008-241514 filed in the Japanese Patent Office on Sep. 19, 2008, the entire content of which is incorporated herein by reference.

BACKGROUND OF THE INVENTION

1. Field of the Invention

The present invention relates to a video display device, a method of displaying connectors, a transmission-line state detection device, a transmission-line state detection method and a semiconductor integrated circuit. More particularly, the invention relates to a video display device and the like capable of checking connection/disconnection of a cable to a connector on a screen easily by changing the appearance of connector indications displayed on a display panel according to a detection output of a cable detection unit which detects connection/disconnection of the cable to the connector.

The invention also relates to a transmission-line state detection device and the like in which a step waveform signal is outputted to a connection portion of a transmission line for performing reception and transmission of a signal, and by detecting the transmission line state based on a reflected signal of the step waveform signal, thereby detecting connection/disconnection of the transmission line to the connection portion, the length of the transmission line connected to the connection portion and the transmission line state such as impedance of the transmission line connected to the connection portion in good condition.

The invention further relates to a semiconductor integrated circuit which includes a connection portion of a transmission line for performing reception and transmission of a signal, further including a transmission-line state detection unit detecting a transmission line state, thereby performing transmission/reception of the signal according to the transmission line state.

2. Description of the Related Art

In recent years, HDMI (High Definition Multimedia Interface) is becoming popular, which is a communication interface transmitting digital video signals, namely, a baseband (uncompressed) video signal and an audio signal related to the video signal at high speed from, for example, a DVD (Digital Versatile Disc) recorder, a set-top box, and other AV sources (Audio Visual Sources) to a TV receiver, a projector and other displays. The details of an HDMI standard are described, for example, in WO2002-078336 (Patent Document 1).

SUMMARY OF THE INVENTION

For example, in a TV receiver which is provided with an HDMI connector (HDMI terminal), the HDMI connector does not have a cable detection function. Therefore, it is difficult that a user checks connection/disconnection of a cable to the HDMI connector on a display panel, and for example, when performing input switching by displaying respective connectors including the HDMI connector on the display panel, the user has to perform futile operation such as selecting the HDMI connector to which the cable is not connected.

In the TV receiver, it is possible to detect that a source device in an active state is connected to the HDMI connector through the cable by HPD (Hot Plug Detect) prescribed by the HDMI. It is difficult to detect even connection/disconnection of the cable because the source device is in the same state as a case in which the cable is not connected when the source device is not in the active state.

It is desirable to allow connection/disconnection of the cable to the connector to be checked on a screen. It is also desirable to allow the state of a transmission-line state such as connection/disconnection of the connector to be checked without adding a cable detection mechanism to the connector. Furthermore, it is desirable to provide a semiconductor integrated circuit which is capable of transmitting/receiving a signal according to the transmission-line state.

According to an embodiment of the invention, there is provided a video display device including connectors to which cables transmitting video signals are connected, a display panel displaying video by the video signal inputted to the connector from an external device through the cable, a display control unit displaying connector indications indicating the connectors on the display panel, a cable detection unit outputting a step waveform signal to the connector and detecting connection/disconnection of the cable to the connector based on a reflected signal of the step waveform signal, in which the display control unit changes the appearance of the connector indications displayed on the display panel according to a detection output of the cable detection unit.

In the embodiment of the invention, connectors to which cables transmitting video signals are connected are included, and video by the video signal inputted to the connector from the external device through the cable is displayed on the display panel. On the display panel, connector indications indicating connectors (marks, characteristics and the like) are displayed on, for example, a user interface screen when performing input switching. The connector is a connector for inputting a baseband video signal transmitted from an external device by differential signals in plural channels through the cable such as an HDMI connector.

Connection/disconnection of the cable to the connector is detected by the cable detection unit. In this case, the step waveform signal is outputted to the connector, and connection/disconnection of the cable to the connector is detected based on a reflected signal of the step waveform signal. There is less danger of failure as well as cost increase can be suppressed in this system as compared with the case in which a cable detection mechanism such as a detection switch is added to the connector.

The appearance of connector indications displayed on the display panel such as tone, hue, shape and the like is changed by the display control unit according to the detection output of the cable detection unit. For example, connector indications indicating connectors to which cables are not connected are displayed lighter than connector indications indicating connectors to which cables are connected. As described above, the appearance of connector indications displayed on the display panel is changed based on whether the cable is connected or not, therefore, it is possible to check connection/disconnection of the cable to the connector on the screen easily, which improves selection operationality of the external input.

According to the embodiment of the invention, it is also preferable that the display control unit displays device indications indicating devices connected to the connector in relation to the connector indications indicating the connectors to which the cables are connected, which are displayed on the display panel. In this case, the user can check devices connected to the connector on the screen easily, and the selection operationality of the external input can be improved.

Also according to the embodiment of the invention, the video display device may further include a user operation unit performing input switching by selecting the connector indication displayed on the display panel and a selection limitation unit limiting connector indications which can be selected by the user operation unit to connector indications indicating connectors to which cables are connected according to the detection result of the cable detection unit. In this case, for example, a cursor for selection is moved only to connector indications indicating connectors to which cables are connected selectively, therefore, it is possible to save wasted motion of the cursor by the user, in addition, it is possible to prevent the user from accidentally selecting the connector indication to which the cable is not connected.

In this case, the display control unit may display connector indications which can be selected by the user operation unit by gathering the indications together in a given range. Accordingly, it is possible to avoid difficulty in seeing the cursor for selection which moves at irregular intervals. Also in this case, it is preferable that the display control unit does not display connector indications indicating connectors to which the cables are not connected on the display panel. Accordingly, it is possible to eliminate unnecessary connector indications from the display panel, which makes connector indications indicating selectable connectors conspicuous.

According to the embodiment of the invention, the video display device further includes an active determination unit determining whether an external device in an active state is connected through the cable or not based on a potential state of a prescribed line of the cable connected to the connector, in which the display control unit changes the appearance of connector indications displayed on the display panel according to the detected output of the cable detection unit as well as the determination result of the active determination unit. In this case, it is possible to check not only connection/disconnection of the cable to the connector but also connection of the external device in the active state to the connector to which the cable is connected on the screen easily.

According to another embodiment of the invention, there is provided a transmission-line state detection device outputting a step waveform signal to a connection portion of a transmission line for performing reception or transmission of a signal and detecting a state of the transmission line based on a reflected signal of the step waveform signal.

In the embodiment of the invention, transmission line states such as connection/disconnection of the transmission line to the connection portion, the length of the transmission line connected to the connection portion and impedance of the transmission line connected to the connection portion can be detected in good condition.

For example, the transmission line state to be detected is connection/disconnection of the transmission line to the connection portion, and the transmission-line state detection device includes a signal output unit outputting the step waveform signal to the connector through an output resistance having a resistance value corresponding to impedance of the transmission line, a reference signal generation unit generating a comparison reference signal having a value obtained by attenuating the maximum value of the step waveform signal by a fixed attenuation rate, a timing signal generation unit generating a timing signal at a point delayed from a rising point of the step waveform signal by a given period of time, and a latched comparator obtaining a detection output by latching a comparison result between a signal obtained at the output side of the signal output unit and the comparison reference signal generated by the reference generation unit by the timing signal generated by the timing generation unit. In this case, the detection output is in one state when the transmission line is connected to the connection portion, on the other hand, the detection output is in another state when the transmission line is not connected to the connection portion.

Also, for example, the transmission line state to be detected is the length of the transmission line connected to the connection portion, and the transmission-line state detection device includes a signal output unit outputting the step waveform signal to the connector through an output resistance having a resistance value corresponding to impedance of the transmission line, a reference signal generation unit generating a comparison reference signal having a value obtained by attenuating the maximum value of the step waveform signal by a fixed attenuation rate, a timing signal generation unit generating a timing signal at a point delayed from a rising point of the step waveform signal by a given period of time, a latched comparator latching a comparison result between a signal obtained at the output side of the signal output unit and the comparison reference signal generated by the reference generation unit by the timing signal generated by the timing generation unit, and a control unit extending the given period of time in the timing signal generation unit in stages or shortening the given period of time in stages until an output of the latched comparator changes from one state to another state as well as generating the step waveform signal in each stage. In this case, the length of the transmission line connected to the connection portion is the length which can be observed in a prescribed period of time during which the output of the latched comparator is changed from one state to another state.

Also, for example, the transmission line state to be detected is impedance of the transmission line connected to the connection portion, and the transmission-line state detection device includes a signal output unit outputting the step waveform signal to the connector through an output resistance, a reference signal generation unit generating a comparison reference signal having a value obtained by attenuating the maximum value of the step waveform signal by a fixed attenuation rate, a timing signal generation unit generating a timing signal at a point delayed from a rising point of the step waveform signal by a given period of time, a latched comparator latching a comparison result between a signal obtained at the output side of the signal output unit and the comparison reference signal generated by the reference generation unit by the timing signal generated by the timing generation unit, and a control unit increasing a resistance value of the output resistance in the signal output unit in stages or reducing the resistance value in stages until an output of the latched comparator changes from one state to another state as well as generating the step waveform signal in each stage. In this case, the impedance of the transmission line connected to the connection portion is a resistance value of the output resistance when the output of the latched comparator is changed from one state to another state.

According to still another embodiment of the invention, there is provided a semiconductor integrated circuit including a connection portion of a transmission line for performing reception or transmission of a signal, and a transmission-line state detection unit detecting a state of the transmission line.

In the embodiment of the invention, the transmission-line state detection unit is provided, and the transmission-line states can be detected by the transmission-line state detection unit. For example, in the transmission-line state detection unit, a step waveform signal is outputted to the connection portion, and the transmission-line states are detected based on a reflected signal of the step waveform signal. The transmission-line states are, for example, connection/disconnection of the transmission line to the connection portion, the length of the transmission line connected to the connection portion, impedance of the transmission line connected to the connection portion and the like.

In the semiconductor integrated circuit including the above transmission-line state detection unit, transmission/reception of signals in accordance with the transmission-line states can be realized. For example, when connection/disconnection of the transmission line to the connection portion is detected, transmission/reception operation of signals can be performed only when the connection line is connected to the connected portion. Also, for example, when the length of the transmission line is detected, the level of a transmission signal can be adjusted to the optimum level according to the length thereof, which realizes reduction of unnecessary radiation as well as saves power consumption.

Additionally, for example, when the length of the transmission line is detected, it is possible to recognize the difference of pattern lengths of respective lines, to adjust data output timing of respective lines and to suppress skew in a memory interface. Accordingly, it is possible to eliminate patterns which have been drawn unnecessarily long for performing same-length wiring from the substrate, which saves the substrate space as well as reduces unnecessary radiation.

Also, when the impedance of the transmission line is detected, for example, in the case of using a cheap cable in which impedance is not properly controlled, it is possible to select the optimum output resistance with respect to the transmission line. Accordingly, it is possible to perform stable transmission by suppressing reflection, which can reduce unnecessary radiation.

In the video display device and the method of displaying connectors according to the embodiments of the invention, the appearance of connector indications displayed on the display panel is changed according to the detection output of the cable detection unit which detects connection/disconnection of the cable to the connector, which allows connection/disconnection of the cable to the connector to be checked on the screen easily.

In the transmission-line state detection device and the transmission-line state detection method according to the embodiments of the invention, the step waveform signal is outputted to the connection portion of the transmission line for performing reception or transmission of a signal, and the transmission-line states are detected based on the reflected signal of the step waveform signal. It is possible to detect transmission-line states such as connection/disconnection of the transmission line to the connection portion, the length of the transmission line connected to the connection portion and impedance of the transmission line connected to the connection portion in good condition.

In the semiconductor integrated circuit according to the embodiments of the invention, the connection portion of the transmission line for performing transmission or reception of a signal is provided, and further, the transmission-line state detection unit detecting a state of the transmission line is provided, which can perform transmission/reception of the signal in accordance with the state of the transmission line.

BRIEF DESCRIPTION OF THE DRAWINGS

FIG. 5 is a chart showing pin arrangement (type A) of an HDMI connector;

FIG. 17A and FIG. 17B are views for explaining connector indications displayed on a display panel at the time of selecting an external input;

FIG. 18A and FIG. 18B are views for explaining connector indications displayed on the display panel at the time of selecting an external input;

FIG. 21A and FIG. 21B are block diagrams showing configuration examples of a communication system between ICs according to a second embodiment of the invention;

DESCRIPTION OF THE PREFERRED EMBODIMENTS

Hereinafter, the preferred embodiments (referred to as "embodiments" in the following description) will be explained. The explanation will be made in the following order.
1. First Embodiment (Video display, Detection of cable connection/disconnection)
2. Second Embodiment (Communication between ICs, Detection of cable length)
3. Third Embodiment (Memory interface, Detection of pattern length)
4. Fourth Embodiment (Communication between ICs, Detection of cable impedance)
5. Modification Embodiment
1. First Embodiment
[Configuration Example of a TV Receiver]

Figure 1:
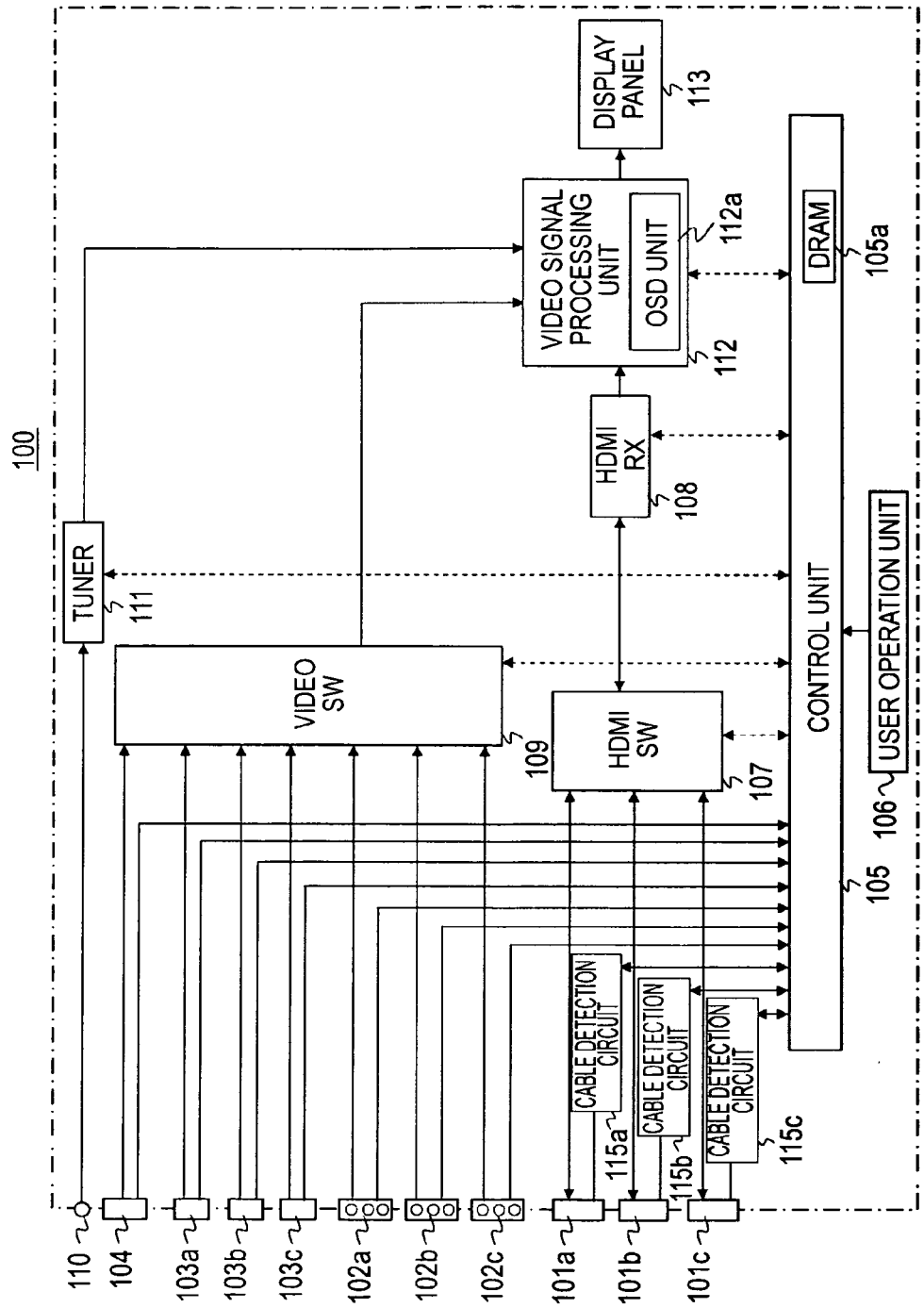
FIG. 1 is a block diagram showing a configuration example of a TV receiver according to a first embodiment of the invention.

FIG. 1 is a configuration example of a TV receiver 100 according to an embodiment. For simple explanation, explanation about an audio system will be omitted in the following description.

The TV receiver 100 includes HDMI connectors 101a to 101c, component video connectors 102a to 102c, composite video connectors 103a to 103c and a PC (Personal Computer) connector 104. The TV receiver 100 also includes a control unit 105, a user operation unit 106, an HDMI switcher (HDMISW) 107, an HDMI receiving unit (HDMI RX) 108 and a video switcher (video SW) 109. The TV receiver 100 further includes an antenna terminal 110, a tuner 111, a video signal processing unit 112, a display panel 113, cable detection circuits 115a to 115c. The TV receiver 100 forms a sink device of HDMI.

The control unit 105 controls operation of respective units of the TV receiver 100. The user operation unit 106 forms a user interface, connected to the control unit 105. The user operation 106 includes keys, buttons, dials arranged in a not-shown casing of the TV receiver 100, or a remote controlled transmitter/receiver and the like.

The control unit 105 includes a DRAM 105a. The DRAM 105a stores cable connection information to the HDMI connectors 101a to 101c, the component video connectors 102a to 102c, the composite video connectors 103a to 103c and the PC connector 104, connection information of external devices in the active state to the HDMI connectors 101a to 101c and the like.

The cable connection information of the component video connectors 102a to 102c, the composite video connectors 103a to 103c and the PC connector 104 is obtained by a cable detection mechanism (not shown in FIG. 1) included in each connector. The cable detection mechanism is configured to detect cable connection to the connector by, for example, a mechanical switch. The cable connection information of the HDMI connectors 101a to 101c is obtained by the cable detection circuits 115a to 115c, the details of which will be described later.

The connection information of external devices (source devices) in the active state to the HDMI connectors 101a to 101c is obtained from a potential state of a 19 pin, namely, an HPD (Hot Plug Detect) pin. That is, when the external device in the active state is connected, voltage of the HPD pin is increased. Therefore, the control unit 105 can obtain the connection information by monitoring the voltage of the HPD pin. In this sense, the control unit 105 forms an active determination unit.

The control unit 105 changes the appearance of connector indications displayed on the display panel 113, for example, when the user selects an external input based on the above-described cable connection information and the connection information of external devices in the active state. In this sense, the control unit 105 forms a display control unit. The details of display control in the control unit 105 will be described later.

The HDMI switcher 107 selectively connects the HDMI connectors 101a to 101c to the HDMI receiving unit 108 under control by the control unit 105. The HDMI receiving unit 108 is selectively connected to any of the HDMI connectors 101a to 101c through the HDMI switcher 107. The HDMI receiving unit 108 receives baseband video signals transmitted in one direction from external devices (source devices) connected to the HDMI connectors 101a to 101c by communication complying with HDMI.

In this case, the HDMI receiving unit 108 receives the baseband video signal from the external device after authentication of HDCP (High-bandwidth Digital Content Protection system) is performed between the unit and the external device mutually. The details of the HDMI receiving unit 108 will be described later.

The video switcher 109 selectively takes and outputs one-system video signal from video signals inputted to the component video connectors 102a to 102c, the composite video connectors 103a to 103c and the PC connector 104. The tuner 111 receives BS (Broadcasting Satellite) broadcasting, digitalized terrestrial broadcasting and so on, outputting a video signal of a given program of a selected station. To the tuner 111, broadcasting signals caught by a not-shown antenna connected to the antenna terminal 110 are inputted.

The video signal processing unit 112 performs multi-screen processing, superimposing processing of an information display signal for a user interface screen and the like to the video signal for video display according to need, which is selected based on the selection operation by the user from a video signal outputted from the HDMI receiving unit 108, a video signal outputted from the video switcher 109 and a video signal outputted from the tuner 111. The information display signal for the user interface screen is generated by an OSD (on Screen Display) circuit 112a included in the video signal processing unit 112 under the control of the control unit 105. The video signal processing unit 112 drives the display panel 113 based on the video signal after processing. The display panel 113 is formed by an LCD (Liquid Crystal Display), PDP (Plasma Display Panel) and the like.

The cable detection circuits 115a to 115c detect connection/disconnection of the HDMI cable to the HDMI connectors 101a to 101b. Each cable detection circuit outputs a step waveform signal to the HDMI connector, detecting connection/disconnection of the HDMI cable to the HDMI connector based on a reflected signal of the step waveform signal. The cable detection circuit 115a to 115c supply the detected output to the control unit 105 as cable connection information of the HDMI connectors 101a to 101c. The details of the cable detection circuits 115a to 115c will be described later.

[Operation Example of the TV Receiver]

An operation example of the TV receiver 100 shown in FIG. 1 will be explained. A baseband video signal is transmitted to the HDMI receiving unit 108 from an external device (source device) in the active state, which is connected to the HDMI connector selected by the HDMI switcher 107, after encryption and the like are performed to the signal. In the HDMI receiving unit 108, decryption processing and the like are performed to the received video signal to thereby obtain a video signal. The video signal outputted from the HDMI receiving unit 108 is supplied the video signal processing unit 112.

Video signals inputted to the component video connectors 102a to 102c, the composite video connectors 103a to 103c and the PC connector 104 are supplied to the video switcher 109, and one system video signal is selected in the video switcher 109 and outputted. The video signal outputted from the video switcher 109 is supplied to the video signal processing unit 112.

A broadcasting signal inputted to the antenna terminal 110 is supplied to the tuner 111. In the tuner 111, a video signal of a given program is obtained in accordance with the channel selection operation by the user based on the broadcasting signal. The video signal outputted from the tuner 111 is supplied to the video signal processing unit 112.

In the video signal processing unit 112, a video signal for video display is selected in the video signal outputted from the HDMI receiving unit 108, the video signal outputted from the video switcher 109 and the video signal outputted from the tuner 111 based on the selection operation by the user. Then, the multi-screen processing, superimposing processing of an information display signal and the like are performed to the selected video signal according to need in the video signal processing unit 112, and the display panel 113 is driven based on the processed video signal. Accordingly, video by the video signal for video display selected based on the selection operation by the user is displayed on the display panel 113. The information display is superimposed on the video according to need.

[Configuration Examples of an HDMI Transmission Unit, an HDMI Receiving Unit]

Figure 2:
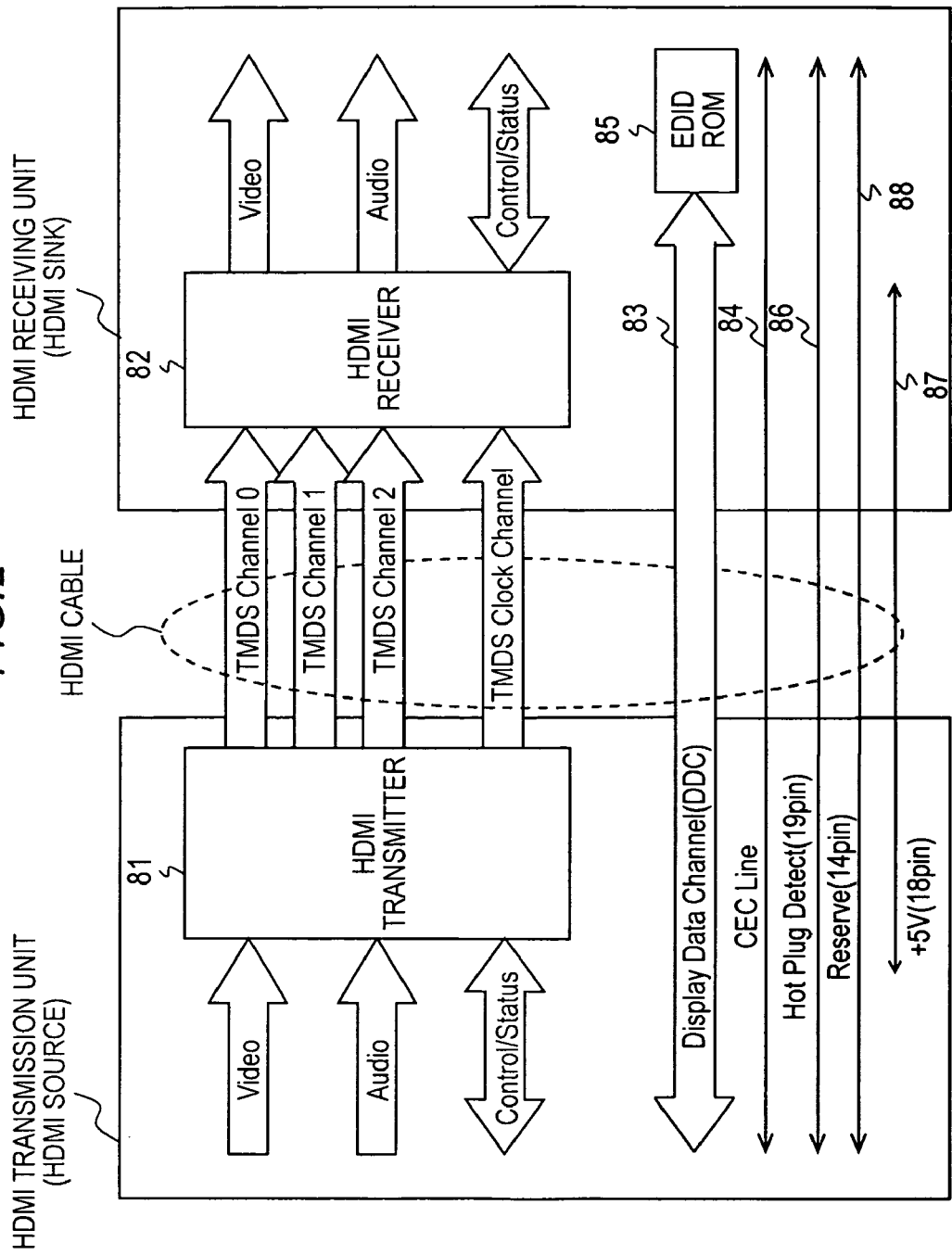
FIG. 2 is a block diagram showing a configuration example of an HDMI transmission unit of a source device and an HDMI receiving unit of a sink device.

FIG. 2 shows configuration examples of the HDMI transmission unit (HDMI source) of an HDMI source device and an HDMI receiving unit (HDMI sink) of a sink device.

The HDMI transmission unit transmits differential signals corresponding to pixel data of video of one screen in the uncompressed state to the HDMI receiving unit through plural channels in one direction during an active image period (hereinafter, referred to as an active video period appropriately) which is a period obtained by subtracting a horizontal blanking period and a vertical blanking period from a period from one vertical synchronization signal to a next vertical synchronization signal as well as transmits differential signals corresponding to at least audio data (audio signal), control data, other auxiliary data and the like related to video data (video signal) to the HDMI receiving unit through plural channels in one direction during the horizontal blanking period or the vertical blanking period.

That is, the HDMI transmission unit includes an HDMI transmitter 81. The transmitter 81 converts, for example, pixel data of uncompressed video into corresponding differential signals and performs serial transmission of the signals to the HDMI receiving unit in one direction, which is connected through the HDMI cable, through three TMDS channels #0, #1 and #2 which are plural channels.

The transmitter 81 also converts audio data, further, necessary control data, other auxiliary data and the like related to the uncompressed video into corresponding differential signals and performs serial transmission of signals through the three TMDS channels #0, #1 and #2 to the HDMI receiving unit connected through the HDMI cable.

Furthermore, the transmitter 81 transmits a pixel clock synchronized with pixel data to be transmitted through the three TMDS channels #0, #1 and #2 to the HDMI receiving unit connected through the HDMI cable through a TMDS clock channel. Here, in one TMDS channel #i (i=0, 1, 2), 10-bit pixel data is transmitted during one clock of the pixel clock.

The HDMI receiving unit receives differential signals corresponding to pixel data, which are transmitted from the HDMI transmission unit through plural channels in one direction during the active video period as well as receives differential signals corresponding to audio data, control data and the like, which are transmitted from the HDMI transmission unit through plural channels in one direction during the horizontal blanking period or the vertical blanking period.

That is, the HDMI receiving unit includes an HDMI receiver 82. The receiver 82 receives differential signals corresponding to pixel data and differential signals corresponding to audio data and control data, which are transmitted from the HDMI transmission unit connected through the HDMI cable in one direction through the TMDS channels #0, #1 and #2 so that the signals are synchronized with the pixel clock which is also transmitted from the HDMI transmission unit through the TMDS clock channel.

As transmission channels of the HDMI system including the HDMI transmission unit and the HDMI receiving unit, there are transmission channels called a DDC (Display Data Channel) 83 and a CEC line 84 in addition to the three TMDS channels #0 to #3 as transmission channels for performing serial transmission of pixel data and audio data in one direction from the HDMI transmission unit to the HDMI receiving unit so as to be synchronized with the pixel clock and the TMDS clock channel as the transmission channel for transmitting the pixel clock.

The DDC 83 includes not-shown two signal lines included in the HDMI cable, which is used for reading E-EDID (Enhanced Extended Display Identification Data) by the HDMI transmission unit from the HDMI receiving unit connected through the HDMI cable.

That is, the HDMI receiving unit includes an EDID ROM (Read Only Memory) 85 which stores E-EDID as information concerning configuration/capability of itself, in addition to the HDMI receiver 82. The HDMI transmission unit reads the E-EDID of the HDMI receiving unit through the DDC 83 from the HDMI receiving unit connected through the HDMI cable, recognizing a format (profile) of video corresponding to, for example, an electronic device which has the HDMI receiving unit, such as RGB, YCbCr4:4:4, YCbCr4:2:2 and the like based on the E-EDED.

The CEC line 84 includes not-shown one signal line included in the HDMI cable, which is used for performing bi-directional communication of data for control between the HDMI transmission unit and the HDMI receiving unit.

The HDMI cable also includes a line 86 to be connected to a pin called HPD (Hot Plug Direct). The source device can detect connection of the sink device by using the line 86. The HDMI cable further includes a line 87 used for supplying power from the source device to the sink device. Furthermore, the HDMI cable includes a reserve line 88.

Figure 3:
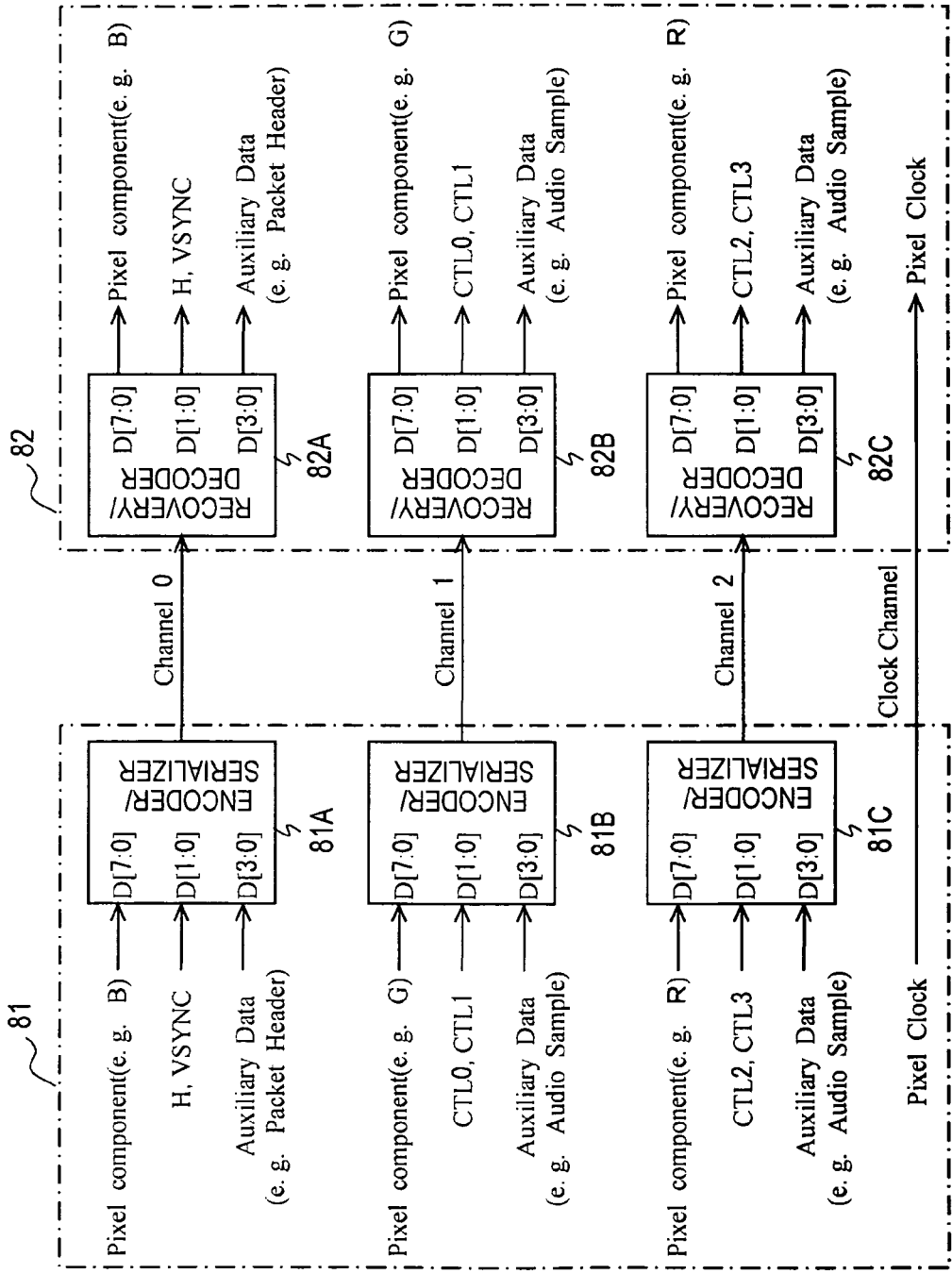
FIG. 3 is a block diagram showing a configuration example of an HDMI transmitter and an HDMI receiver.

FIG. 3 shows configuration examples of the HDMI transmitter 81 and the HDMI receiver 82 of FIG. 2.

The transmitter 81 includes three encoders/serializers 81A, 81B, and 81C respectively corresponding to the three TMDS channels #0, #1 and #2. Respective encoders/serializers 81A, 81B, and 81C encode video data, auxiliary data and control data supplied thereto, converting data from parallel data into serial data, and transmitting the data by differential signals. Here, when video data includes, for example, three components of R (red), G (green) and B (blue), B-component is supplied to the encoder/serializer 81A, G-component is supplied to the encoder/serializer 82B and R-component is supplied to the encoder/serializer 81C.

As auxiliary data, for example, there are audio data and control packets. The control packets are supplied to, for example, the encoder/serializer 81A and the audio data is supplied to the encoders/serializers 81B and 81C.

As control data, for example, there are a 1-bit vertical synchronization signal (VSYNC) and a 1-bit horizontal synchronization signal (HSYNC) and 1-bit control bits CTL0, CTL1, CTL2 and CTL3. The vertical synchronization signal and the horizontal synchronization signal are supplied to the encoder/serializer 81A. The control bits CTL0, CTL1 are supplied to the encoder/serializer 81B, and the control bits CTL2, CTL3 are supplied to the encoder/serializer 81C.

The encoder/serializer 81A transmits B-component of video data, the vertical synchronization signal, the horizontal synchronization signal and auxiliary data supplied thereto in time division. That is, the encoder/serializer 81A makes B-component of video data supplied thereto be parallel data of the 8-bit unit which is a fixed bit number. The encoder/serializer 81A further encodes the parallel data, converting the data into serial data and transmitting the data through the TMDS channel #0.

The encoder/serializer 81A encodes parallel data of 2-bit vertical synchronization signal and the horizontal synchronization signal supplied thereto, converting the data into serial data and transmitting the data through the TMDS channel #0. The encoder/serializer 81A further makes auxiliary data supplied thereto be parallel data of the 4-bit unit. The encoder/serializer 81A encodes the parallel data, converting the data into serial data and transmitting the data through the TMDS channel #0.

The encoder/serializer 81B transmits G-component of video data, the control bits CTL0, CTL1 and the auxiliary data supplied thereto in time division. That is, the encoder/serializer 81B makes G-component of video data supplied thereto be parallel data of the 8-bit unit which is a fixed bit number. The encoder/serializer 81B further encodes the parallel data, converting the data into serial data and transmitting the data through the TMDS channel #1.

The encoder/serializer 81B encodes parallel data of 2-bit control bits CTL0, CTL1 supplied thereto, converting the data into serial data and transmitting the data through the TMDS channel #1. The encoder/serializer 81B further makes auxiliary data supplied thereto be parallel data of the 4-bit unit. The encoder/serializer 81B encodes the parallel data, converting the data into serial data and transmitting the data through the TMDS channel #1.

The encoder/serializer 81C transmits R-component of video data, the control bits CTL2, CTL3 and auxiliary data supplied thereto in time division. That is, the encoder/serializer 81C makes R-component of video data supplied thereto be parallel data of the 8-bit unit which is a fixed bit number. The encoder/serializer 81C further encodes the parallel data, converting the data into serial data and transmitting the data through the TMDS channel #2.

The encoder/serializer 81C encodes parallel data of 2-bit control bits CTL2, CTL3 supplied thereto, converting the data into serial data and transmitting the data through the TMDS channel #2. The encoder/serializer 81C further makes auxiliary data supplied thereto be parallel data of the 4-bit unit. The encoder/serializer 81C encodes the parallel data, converting the data into serial data and transmitting the data through the TMDS channel #2.

The receiver 82 includes three recoveries/decoders 82A, 82B and 82C respectively corresponding to the three TMDS channels #0, #1 and #2. Respective recoveries/decoders 82A, 82B and 82C receive video data, auxiliary data and control data transmitted by differential signals through the TMDS channels #0, #1 and #2. Furthermore, respective recoveries/decoders 82A, 82B and 82C converts video data, auxiliary data and control data from serial data into parallel data, further decoding these data and outputting these data.

That is, the recovery/decoder 82A receives B-component of video data, the vertical synchronization signal, the horizontal synchronization signal and auxiliary data transmitted by differential signals through the TMDS channel #0. Then, the recovery/decoder 82A converts B-component of video data, the vertical synchronization signal, the horizontal synchronization signal and auxiliary data from serial data to parallel data, decoding and outputting the data.

The recovery/decoder 82B receives G-component of video data, control bits CTL0, CTL1 and auxiliary data transmitted by differential signals through the TMDS channel #1. Then, the recovery/decoder 82B converts the G-component of the video data, the control bits CTL0, CTL1 and the auxiliary data from serial data into parallel data, decoding and outputting the data.

The recovery/decoder 82C receives R-component of video data, control bits CTL2, CTL3 and auxiliary data transmitted by differential signals through the TMDS channel #2. Then, the recovery/decoder 82C converts the R-component of the video data, the control bits CTL2, CTL3 and the auxiliary data from serial data into parallel data, decoding and outputting the data.

Figure 4:
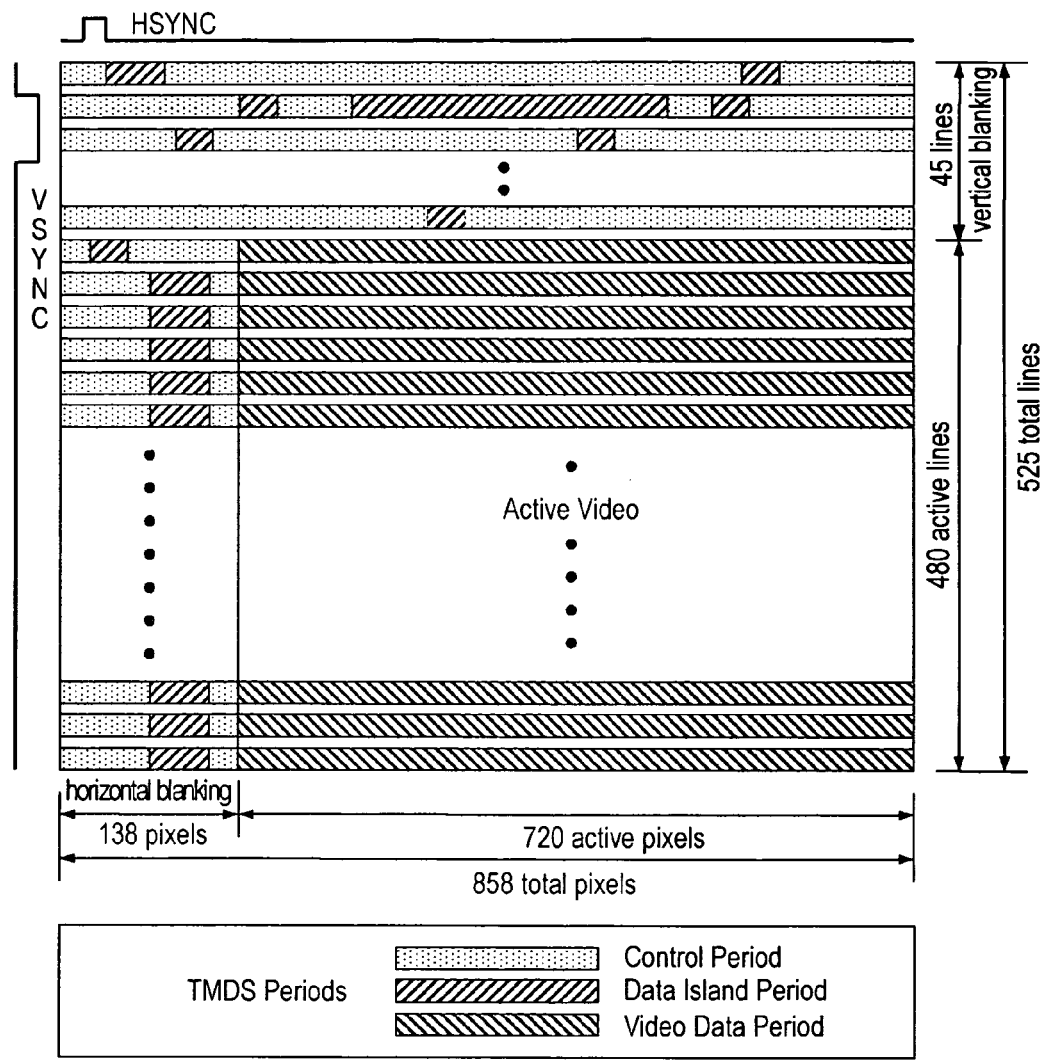
FIG. 4 is a view showing a structure of TMDS transmission data.

FIG. 4 shows an example of transmission periods (length) in which various transmission data is transmitted through the three TMDS channels #0, #1 and #2 of HDMI. FIG. 4 shows periods of various transmission data when progressive video having 720×480 pixels in length and breadth are transmitted in the TMDS channels #0, #1 and #2.

In a video field in which transmission data is transmitted through the three TMDS channels #0, #1 and #2 of HDMI, there exist three types of periods which are a video data period, a data island period and a control period according to types of transmission data.

The video field period indicates a period from a rising (active) edge of a certain vertical synchronization signal to a rising edge of the next vertical synchronization signal, which is divided into a horizontal blanking period, a vertical blanking period and an active video period which is a period obtained by subtracting the horizontal blanking period and the vertical blanking period from the video field period.

The video data period is assigned to the active video period. In the video data period, data of active pixels for 720 pixels× 480 lines which forms uncompressed video data of one screen is transmitted.

The data island period and the control period are assigned to the horizontal blanking period and the vertical blanking period. In the data island period and the control period, auxiliary data is transmitted.

That is, the data island period is assigned to part of the horizontal blanking period and the vertical blanking period. In the data island period, for example, packets of audio data and the like are transmitted as data not related to control in auxiliary data.

The control period is assigned to other part of the horizontal blanking period and the vertical blanking period. In the control period, for example, the vertical synchronization signal, the horizontal synchronization signal, control packets and the like are transmitted as data related to control in auxiliary data.

In the current HDMI, a frequency of the pixel clock transmitted in the TMDS clock channel is, for example, 165 MHz, and in this case, the transmission rate in the data island period is approximately 500 Mbps.

FIG. 5 shows pin arrangement of the HDMI connector. The pin arrangement is an example of a type-A. Two lines which are differential lines in which "TMDS Data#i+" and "TMDS Data#1i-" are transmitted are connected to pins to which "TMDS Data#i+" is assigned (pin numbers 1, 4, and 7) and pins to which "TMDS Data#1i-" is assigned (pin numbers 3, 6 and 9).

The CEC line 84 in which a CEC signal which is data for control is transmitted is connected to a pin whose pin number is 13, and a pin whose pin number is 14 is a reserved pin. A line in which a SDA (Serial Data) signal such as E-EDID is transmitted is connected to a pin whose pin number is 16, and a line in which a SCL (Serial Clock) signal which is a clock signal used for synchronization of the SDA signal at the time of transmission and reception is connected to a pin whose pin number is 15. The above DDC 83 includes a line in which the SDA signal is transmitted and a line in which the SCL signal is transmitted.

As described above, the line 86 for detecting connection of the sink device by the source device is connected to a pin whose pin number is 19. Also as described above, the line 87 for supplying power is connected to a pin whose pin number is 18.

[Configuration Example of the Cable Detection Circuit]

Figure 6:
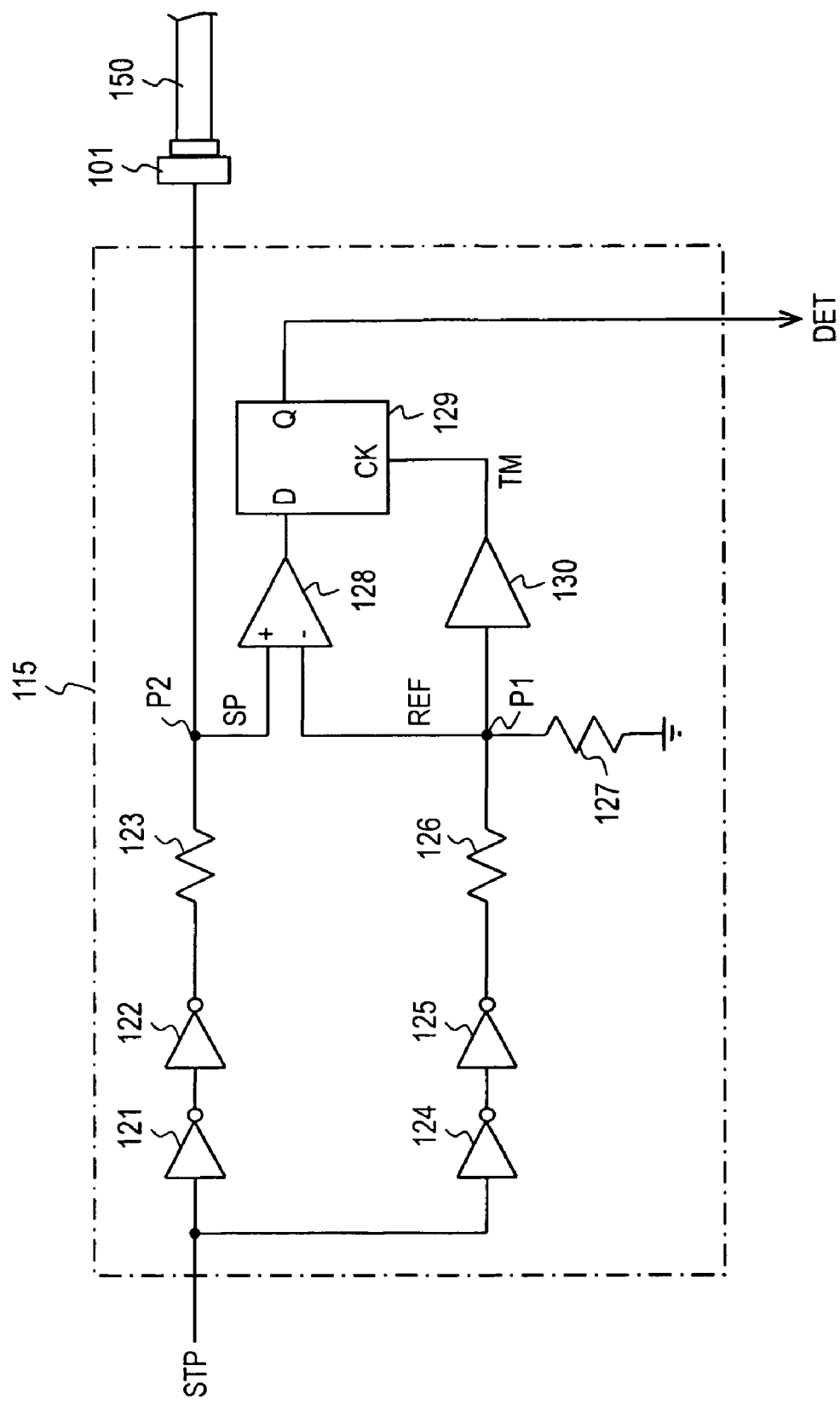
FIG. 6 is a connection diagram showing a configuration example of a cable detection circuit for detecting connection/disconnection of a cable.

FIG. 6 shows a configuration example of the cable detection circuit 115 (115*a* to 115*c*). The cable detection circuit 115 includes inverters 121, 122, 124, 125, an output resistance 123, a dummy output resistance 126, a measurement transmission line reference load 127, a comparator 128, a D flip-flop 129, and a delay circuit 130.

Figure 7:
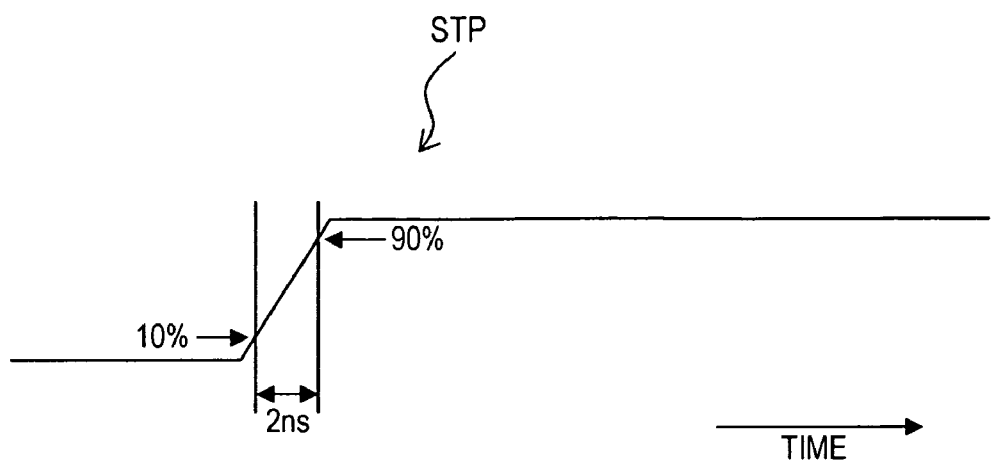
FIG. 7 is a view showing an example of a step waveform signal STP inputted to the cable detection circuit.

The inverters 121, 122 are connected in series, forming a waveform shaping circuit. The inverters 124, 125 are also connected in series, forming a waveform shaping circuit. To the input side of the inverters 121, 122 connected in series and to the input side of the inverters 124, 125 connected in series, a step waveform signal STP is inputted from the control unit 105 (refer to FIG. 1) at the time of detecting connection/disconnection of the cable. The step waveform signal STP has rising time of approximately 2 ns as shown in FIG. 7. The rising time of the step waveform signal STP is not limited to approximately 2 ns. The shorter the rising time becomes, the shorter the length of an HDMI cable 150 which is connected or disconnected can be detected. When the length of the HDMI cable 150 is 50 cm or more, approximately 2 ns of the rising time of the step waveform signal STP is sufficient.

The output side of the inverters 121, 122 connected in series is connected to any pin of the HDMI connector 101 through the output resistance 123. Any pin of other pins except a pin connected to a ground (GND) line (a 17 pin in the example of FIG. 5) is used as the above pin. However, when the pin connected to a power line is used, operation of cable detection is possible only in a power-off state. A resistance value of the output resistance 123 is 50Ω (single end) which is an impedance standard value of the HDMI cable 150 as the transmission line. The inverters 121, 122 connected in series and the output resistance 123 form a signal output unit.

The output side of the inverters 124, 125 connected in series is grounded through the series circuit of the dummy output resistance 126 and the measurement transmission line reference load 127. The dummy output resistance 126 is a resistance, and a resistance value thereof is 50Ω (single end) which is the impedance standard value of the HDMI cable 150 as the transmission line. The measurement transmission line reference load 127 is a resistance, and a resistance value thereof is a value which is a given amount (+α) higher than the upper limit of the impedance standard value of the HDMI cable 150 as the transmission line, for example, 150Ω.

When the resistance value of the dummy output resistance 126 is 50Ω, the resistance value of the measurement transmission line reference load 127 is made to be 150Ω, thereby obtaining an intermediate value between a value of the signal SP with the cable and a value of the signal SP without the cable as a comparison reference signal REF at a taking point (later-described point "t2"), which can give the maximum margin to the cable detection circuit 115.

For example, when the maximum value (a voltage value after rising) of the step waveform signal STP is 1 V, in the case that the value of the output resistance 123 is 50Ω, the value of the signal SP with the cable at the taking point is 0.5 V, and the value of the signal SP without the cable at the taking point is 1 V, therefore, the intermediate value is 0.75 V. When the resistance value of the dummy output resistance 126 is 50Ω, the resistance value of the measurement transmission line reference load 127 at which the comparison reference signal REF obtained at a connection point P1 at the taking point is 0.75 V is calculated as 150Ω.

At the connection point P1 between the dummy output resistance 126 and the measurement transmission line reference load 127, the comparison reference signal REF is obtained, which has a value obtained by attenuating the maximum value of the step waveform signal STP by a fixed attenuation rate. The fixed attenuation rate is determined by resistance values of the dummy resistance dummy 126 and the measurement transmission line reference load 127. For example, when the resistance value of the dummy output resistance 126 is 50Ω and the resistance value of the measurement transmission line reference load 127 is 150Ω as described above, the fixed attenuation rate will be 3/4 . The fixed attenuation rate may be at least an attenuation rate in which a value between the value of the signal SP to which a reflected signal is added and the value of the signal SP to which the reflected signal is not added can be obtained as the comparison reference signal REF. Therefore, the resistance values of the dummy output resistance 126 and the measurement transmission line reference load 127 are not limited to the above values.

The signal SP obtained at a connection point P2 (output side of the signal output unit) between the resistance 123 and the HDMI connector 101 is inputted to a positive-side input terminal of the comparator 128. The comparison reference signal REF obtained at the connection point P1 between the dummy output resistance 126 and the measurement transmission line reference load 127 is inputted to a negative-side input terminal of the comparator 128. The comparator 128 outputs "1" when the signal SP is higher than the comparison reference signal REF, and outputs "0" when the signal SP is lower than the comparison reference signal REF. The output signal of the comparator 128 is inputted to a D terminal of the D flip-flop 129. Here, the comparator 128 and the D flip-flop 129 form a latched comparator.

The delay circuit 130 delays the comparison reference signal REF obtained at the connection point P1 between the output resistance dummy 126 and the measurement transmission line reference load 127 and outputs the signal, generating a timing signal TM at a point delayed from the rising point of the step waveform signal STP by a given period of time. The timing signal TM is supplied to a clock terminal CK of the D flip-flop 129 as a latch signal. Here, the delay circuit 130 forms a timing signal generation unit.

The above given period of time, namely, the delay time of the delay circuit 130 is set based on the rising time of the step waveform signal STP and the length of the HDMI cable 150 connection/disconnection of which will be detected. In the present embodiment, the step waveform signal STP having the rising time of 2 ns is used as described above, and connection/disconnection of the HDMI cable 150 having at least 50 cm or more will be detected, therefore, the given period of time is 5 ns.

At a Q terminal of D flip-flop 129, an output of the comparator 128 is latched by the timing signal generated by the delay circuit 130 and outputted. The Q-terminal output of the D flip-flop 129 is supplied to the control unit 105 (refer to FIG. 1) as a detection output DET of the cable detection circuit 115.

When the HDMI cable 150 is not connected to the HDMI connector 101, the signal SP is in the state that the reflected signal is added at the point of the timing signal TM, therefore, the signal is higher than the comparison reference signal REF and the detection output DET will be "1". On the other hand, when the HDMI cable 150 is connected to the HDMI connector 101, the signal SP is not in the state that the reflected signal is added at the point of the timing signal TM, therefore, the signal is lower than the comparison reference signal REF and the detection output DET will be "0".

Figure 8:
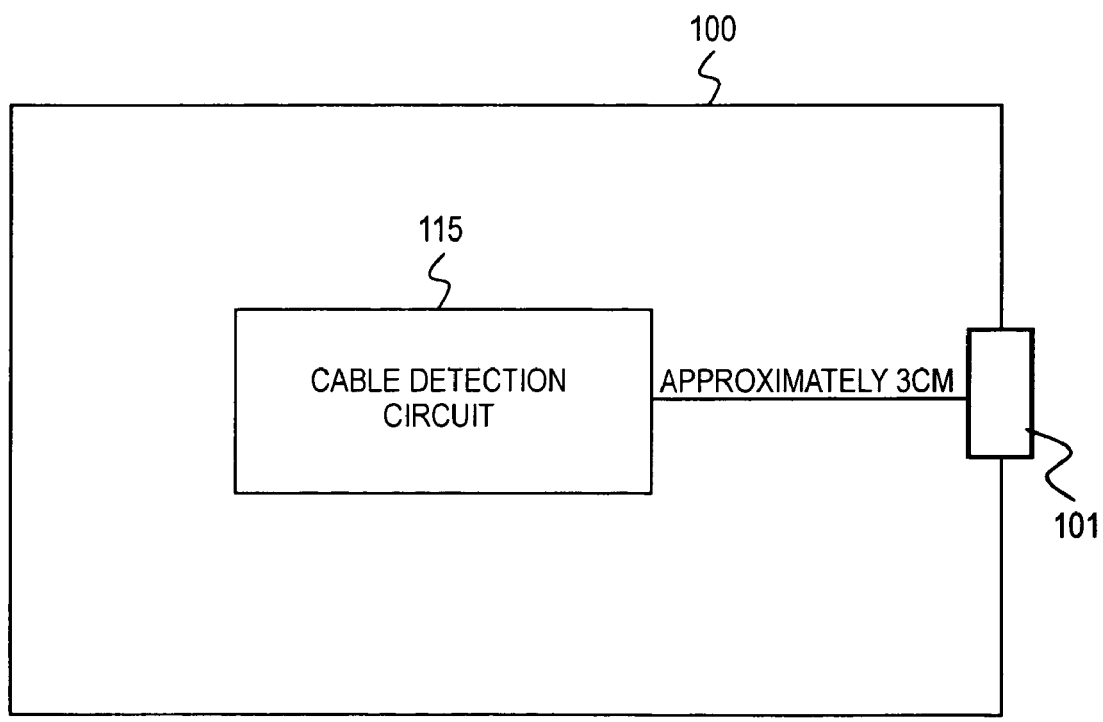
FIG. 8 is a diagram showing an example (without cable connection) of a cable connection state for explaining an operation example of the cable detection circuit.

An operation example of the cable detection circuit 115 shown in FIG. 6 will be explained. First, the case in which the HDMI cable 150 is not connected to the HDMI connector 101 as shown in FIG. 8 will be explained. The length of a signal line from the cable detection circuit 115 to the HDMI terminal 101 is approximately 3 cm.

Figure 9:
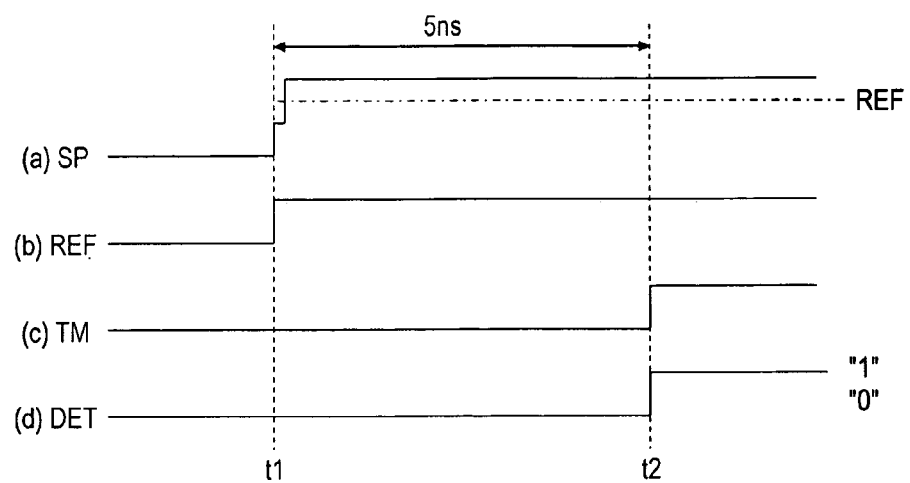
FIG. 9 is a timing chart showing signal waveforms of respective units of the cable detection circuit in the case that the cable is not connected.

FIG. 9 shows signal waveforms of respective units in that case. That is, (a) in FIG. 9 represents the signal SP, (b) in FIG. 9 represents the comparison reference signal REF, (c) in FIG. 9 represents the timing signal TM and (d) in FIG. 9 represents the detection output DET. A point "t1" represents a point at which the step waveform signal STP is inputted and a point "t2" represents a point at which 5 ns has passed from the point "t1", which is given by the timing signal TM.

In this case, impedance is matched only in a substrate after the step waveform signal STP is inputted, therefore, the signal SP is lower than the comparison reference signal REF for a while. However, the signal SP is in the state that the reflected signal is added after that, because the HDMI cable 150 is not connected, and the signal SP is higher than the comparison reference signal REF at the point "t2". Therefore, the output of the comparator 128 is "1" at the point "t2" and the detection output DET obtained by the output of the comparator 128 being latched by the timing signal TM will be "1", which indicates "No cable".

Figure 10:
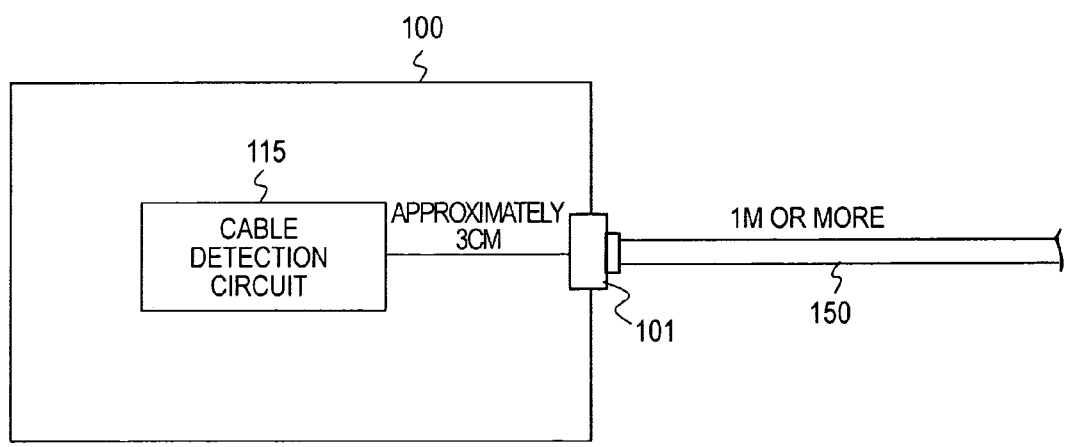
FIG. 10 is a diagram showing another example of the cable connection state (a cable of 1 m or more is connected) for explaining an operation example of the cable detection circuit.

Next, as shown in FIG. 10, the case in which the HDMI cable 150 is connected to the HDMI connector 101 will be explained. The length of the signal line from the cable detection circuit 115 to the HDMI connector 101 is approximately 3 cm and the length of the HDMI cable 150 is 1 m or more.

Figure 11:
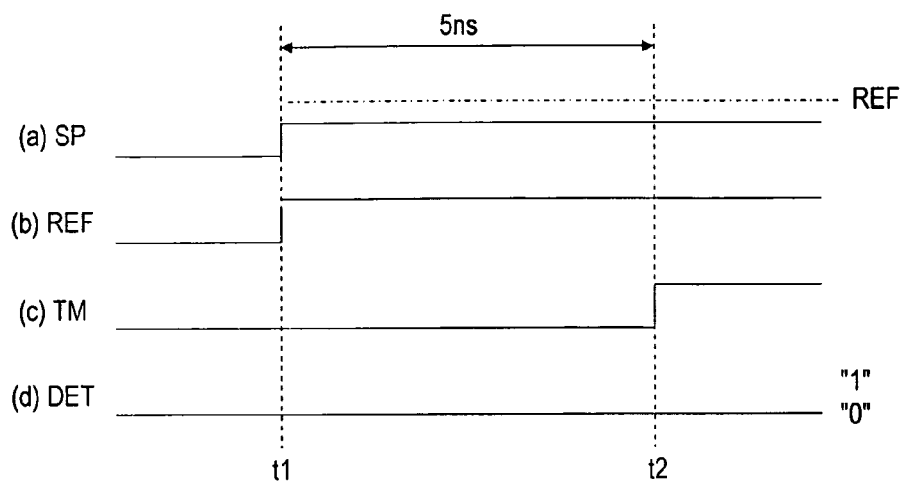
FIG. 11 is a timing chart showing signal waveforms of respective units of the cable detection circuit in the case that the cable of 1 m or more is connected.

FIG. 11 shows signal waveforms of respective units in that case. That is, (a) in FIG. 11 represents the signal SP, (b) in FIG. 11 represents the comparison reference signal REF, (c) in FIG. 11 represents the timing signal TM and (d) in FIG. 11 represents the detection output DET. The point "t1" represents a point at which the step waveform signal STP is inputted and the point "t2" represents a point at which 5 ns has passed from the point "t1", which is given by the timing signal TM.

In this case, impedance is matched in the substrate as well as in the cable after the step waveform signal STP is inputted, therefore, the signal SP is lower than the comparison reference signal REF. Accordingly, the output of the comparator 128 is "0" at the point "t2", and the detection output DET obtained by the output of the comparator 128 being latched by the timing signal TM will be "0", which indicates "Cable exists".

Figure 12:
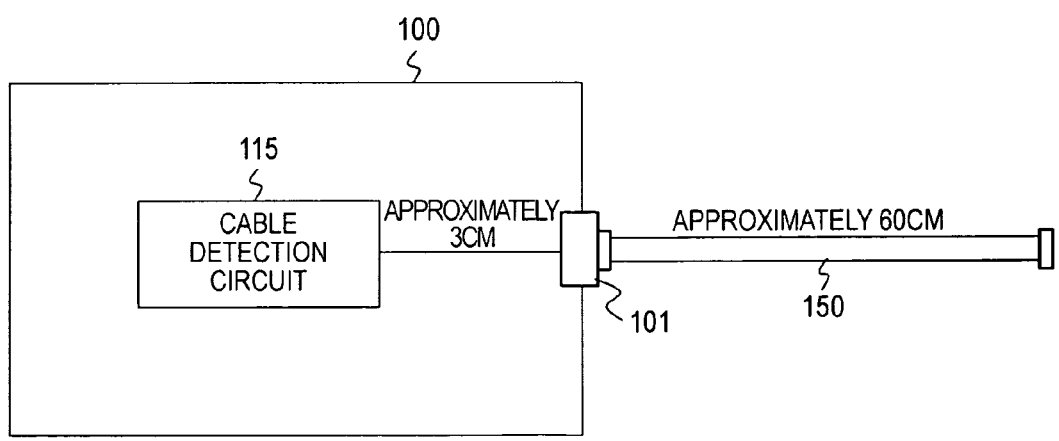
FIG. 12 is a diagram showing another example of the cable connection state (a cable of approximately 60 cm is connected) for explaining an operation example of the cable detection circuit.

Next, as shown in FIG. 12, the case in which the HDMI cable 150 is connected to the HDMI connector 101 will be explained. The length of the signal line from the cable detection circuit 115 to the HDMI connector 101 is approximately 3 cm and the length of the HDMI cable 150 is approximately 60 cm.

Figure 13:
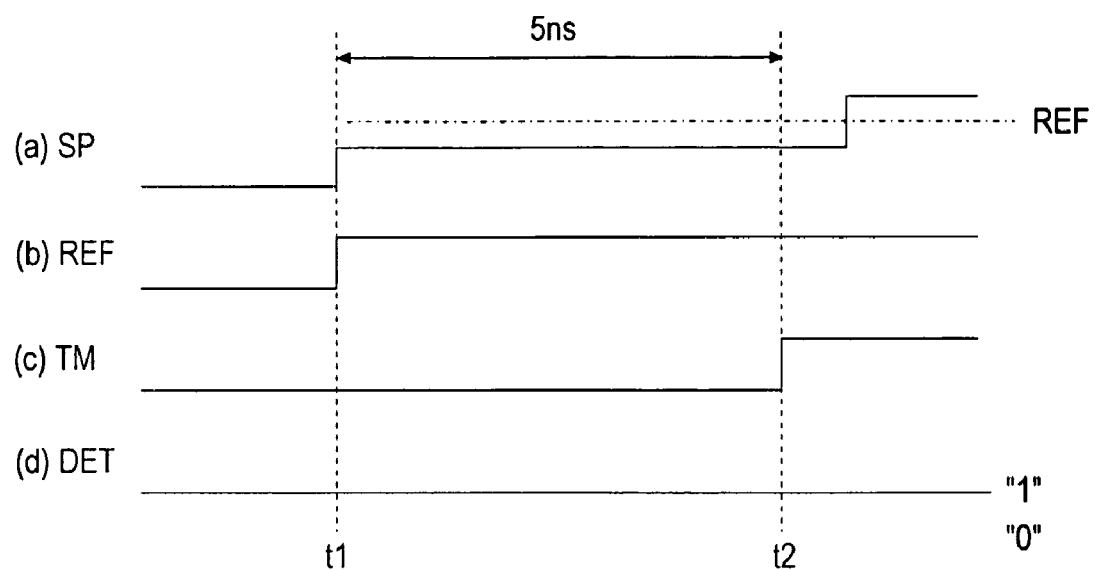
FIG. 13 is a timing chart showing signal waveforms of respective units of the cable detection circuit in the case that the cable of approximately 60 cm is connected.

FIG. 13 shows signal waveforms of respective units in that case. That is, (a) in FIG. 13 represents the signal SP, (b) in FIG. 13 represents the comparison reference signal REF, (c) in FIG. 13 represents the timing signal TM and (d) in FIG. 13 represents the detection output DET. The point "t1" represents a point at which the step waveform signal STP is inputted and the point "t2" represents a point at which 5 ns has passed from the point "t1", which is given by the timing signal TM.

In this case, impedance is matched in the substrate as well as in the cable after the step waveform signal STP is inputted. Since the length of the HDMI cable 150 is 60 cm, the signal SP is lower than the comparison reference signal REF at the point "t2". Therefore, the output of the comparator 128 is "0" at the point "t2", and the detection output DET obtained by the output of the comparator 128 being latched by the timing signal TM will be "0", which indicates "Cable exists". As shown in (a) in FIG. 13, the signal SP becomes in the state that the reflected signal is added and higher than the comparison reference signal REF after passing the point "t2", however, that does not affect the detection output DET because the signal has passed the point "t2".

[Processing of the Control Unit at the Time of Cable Detection]

Next, a processing procedure of the control unit 105 at the time of cable detection will be explained. As described above, at the time of cable detection, the step waveform signal STP is inputted from the control unit 105 to the cable detection circuit 115, after that, the detection output DET is supplied from the cable detection circuit 115 to the control unit 105.

Figure 14:
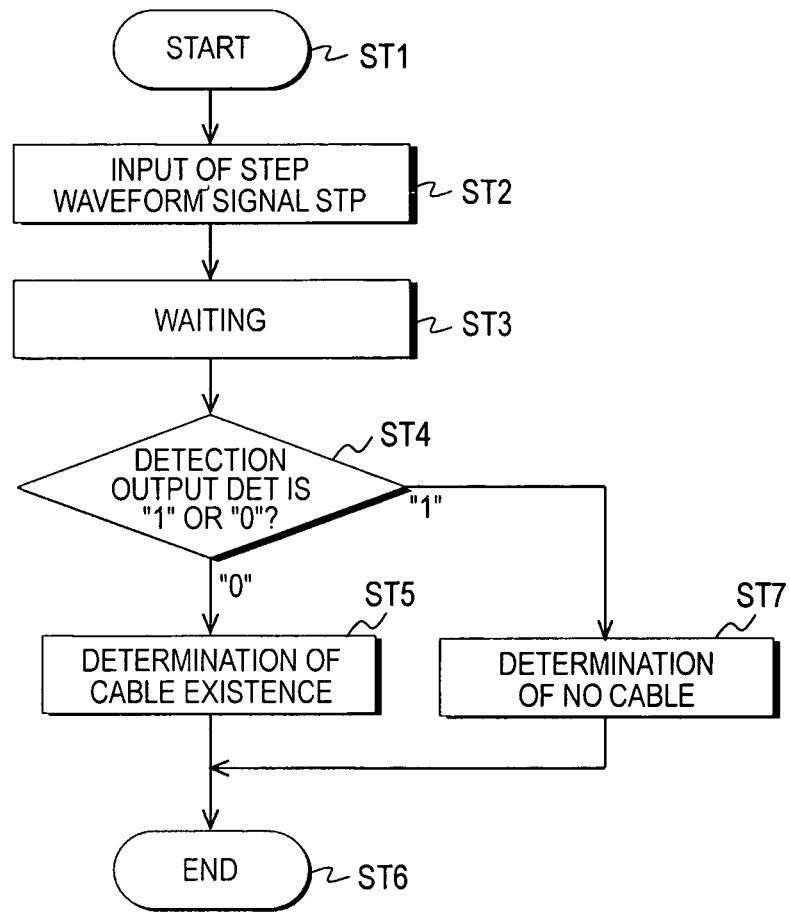
FIG. 14 is a flowchart showing an example of a processing procedure of a control unit at the time of detecting connection/disconnection of the cable.

A flowchart of FIG. 14 shows an example of the processing procedure by the control unit 105 at the time of detecting connection/disconnection of the cable. The control unit 105 starts processing in Step ST1, then, proceeds to processing of Step ST2. In Step ST2, the control unit 105 generates the step waveform signal STP and inputs the signal to the cable detection circuit 115 (refer to FIG. 6).

Next, the control unit 105 waits in Step ST3. In this case, the control unit 105 waits at least until the detection output DET is supplied from the cable detection circuit 115. Then, the control unit 105 determines whether the detection output DET is "1" or "0" in Step ST4.

When the detection output DET is "0", the control unit 105 determines that "Cable exists" in Step ST5, then, ends the processing in Step ST6. On the other hand, when the detection output DET is "1", the control unit 105 determines that "No cable" in Step ST7, then, ends the processing in Step ST6.

[Connector Indications at the Time of Selecting an External Input]

Next, connector indications at the time of selecting an external input by the user will be explained. The control unit 105 changes the appearance of connector indications displayed on the display panel 113 based on the above-described cable connection information and connection information of external devices in the active state.

Figure 15:
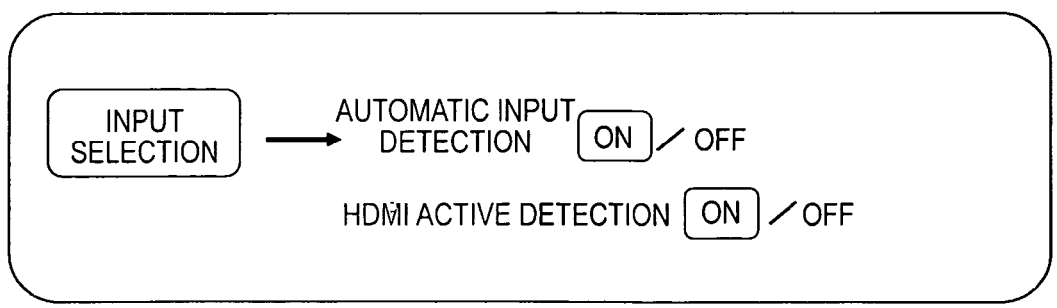
FIG. 15 is a view showing an example of a user interface screen at the time of setting whether cable connection information or connection information of an external device in an active state is used or not.

The user can previously set whether the cable connection information or the connection information of external devices in the active state is used or not in the connector indications at the time of selecting the external input. FIG. 15 shows an example of a user interface screen displayed on the display panel 113 at the time of setting.

In this case, the use of cable connection information is selected by setting automatic input detection to ON. When the automatic input detection is set to ON, the control unit 105 acquires cable connection information to the HDMI connectors 101a to 101c, the component video connectors 102a to 102c, the composite video connectors 103a to 103c and the PC connector 104 as described above at the time of turning on the power, or at prescribed timing such as at the time of selecting the external input, storing the information in the DRAM 105a and using the information as control information for connector indications.

Additionally, the use of connection information of external devices in the active state is selected by setting HDMI active detection to ON. When the HDMI active detection is set to ON, the control unit 105 acquires connection information of external devices in the active state to the HDMI connectors 101a to 101c as described above at the time of turning on the power, or at prescribed timing such as at the time of selecting the external input, storing the information in the DRAM 105a and using the information as control information for connector indications.

Figure 16:
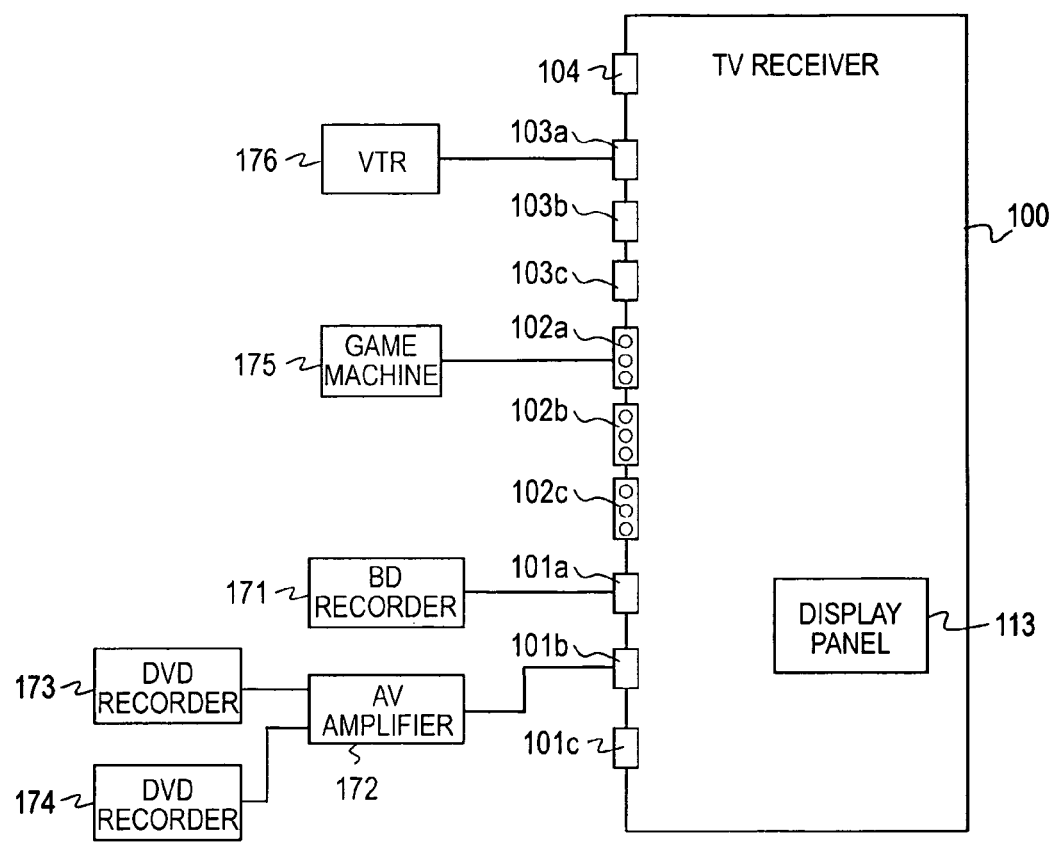
FIG. 16 is a block diagram showing an example of device connection to respective connectors of the TV receiver.

Next, a display example of connector indications at the time of selecting the external input will be explained. The display example indicates a case in which devices are connected to respective connectors of the TV receiver 100 as shown in FIG. 16. That is, a BD (Blu-ray Disc) recorder 171 is connected to the HDMI connector 101a. DVD (Digital Versatile Disc) recorders 173, 174 are connected to the HDMI connector 101b through an AV (Audio-Visual) amplifier 172. A game machine 175 is connected to the component video connector 102a, and a VTR (Video Tape Recorder) 176 is connected to the composite video connector 103a.

First, when the automatic input detection is set to OFF as well as the HDMI active detection is set to OFF, connector indications to be displayed on the display panel 113 at the time of selecting the external input are, for example, as shown in FIG. 17A. In this case, connector indications representing the HDMI connectors 101a to 101c, the component video connectors 102a to 102c, the composite video connectors 103a to 103c and the PC connector 104 are displayed in the same appearance regardless of connection/disconnection of the cable and regardless of connection/disconnection of external devices in the active state in the HDMI connectors 101a to 101c.

Here, connector indications of "HDMI 1" to "HDMI 3" are connector indications indicating the HDMI connector 101a to 101c. "Component 1" to "Component 3" are connector indications indicating the component video connectors 102a to 102c. Also, "Video 1" to "Video 3" are connector indications indicating the composite video connectors 103a to 103c. Further, "PC" is a connector indication indicating the PC connector.

In this state, the user moves a cursor CA to a desired connector position by the user operation unit 106, for example, by operating a remote controller and determines the position, thereby switching input to the desired connector. However, connector indications indicating respective connectors are displayed in the same appearance in this case, therefore, it is difficult that the user recognize whether the cable is connected to each connector or not, and whether the external devices in the active state are connected to the HDMI connectors 101a to 101c or not on the screen of the display panel 113, which may cause futile selection operation.

Next, when the automatic input detection is set to ON as well as the HDMI active detection is set to OFF, connector indications to be displayed on the display panel 113 at the time of selecting the external input are, for example, as shown in FIG. 17B. In this case, connector indications indicating connectors to which the cables are connected ("HDMI 1", "HDMI 2", "Component 1" and "Video 1") are displayed in different appearances, for example, in tone, hue, shape and the like, from connector indications indicating connectors to which cables are not connected ("HDMI 3" "Component 2", "Component 3", "Video 2", "Video 3" and "PC"). For example, connector indications indicating connectors to which cables are not connected are displayed lighter than connector indications indicating connectors to which cables are connected.

In this state, the user moves the cursor CA to a desired position of connector indications by the user operation unit 106, for example, by operating a remote controller and determines the position, thereby switching input to the desired connector. In this case, appearances of connector indications are different according to connection/disconnection of cables, therefore, the user can recognize connection/disconnection of cables to respective connectors on the screen of the display panel 113, which prevents futile selection operation such as selecting the connector to which the cable is not connected.

In this case, it is also preferable that selection operation of the connector indications by the user is limited to connector indications indicating connectors to which cables are connected by the control of the control unit 105. In this case, the user can move the cursor CA only to positions of connector indications indicating connectors to which cables are connected by the user operation unit 106, for example, remote-control operation, which saves wasted motion of the cursor by the user, in addition, which prevents the user from accidentally selecting the connector indication to which the cable is not connected.

Also in this case, it is preferable that connector indications indicating connectors to which cables are connected, namely, which can be selected by the user are displayed by gathering indications together, for example, in a given range as shown in FIG. 18A. In the shown example, the connector indications are gathered together and displayed in an upper range, however, it is also preferable that they are displayed in other ranges, for example, in a lower range. The connector indications are displayed together in the given range as described above, thereby avoiding difficulty in seeing the cursor CA which moves at irregular intervals, which improves operationality.

When the connector indications are displayed together in the given range, it is also preferable that indications are sorted in the order of selection frequency automatically or sorted by the user optionally. It is also preferable that connector indications indicating connectors to which cables are not connected, namely, connectors not selected by the user are not displayed on the display panel 113 as shown in FIG. 18B. In this case, unnecessary connector indications can be removed from the display panel, which allows the connector indications indicating selectable connectors to be easily seen, as a result, operationality is improved.

Figure 19:
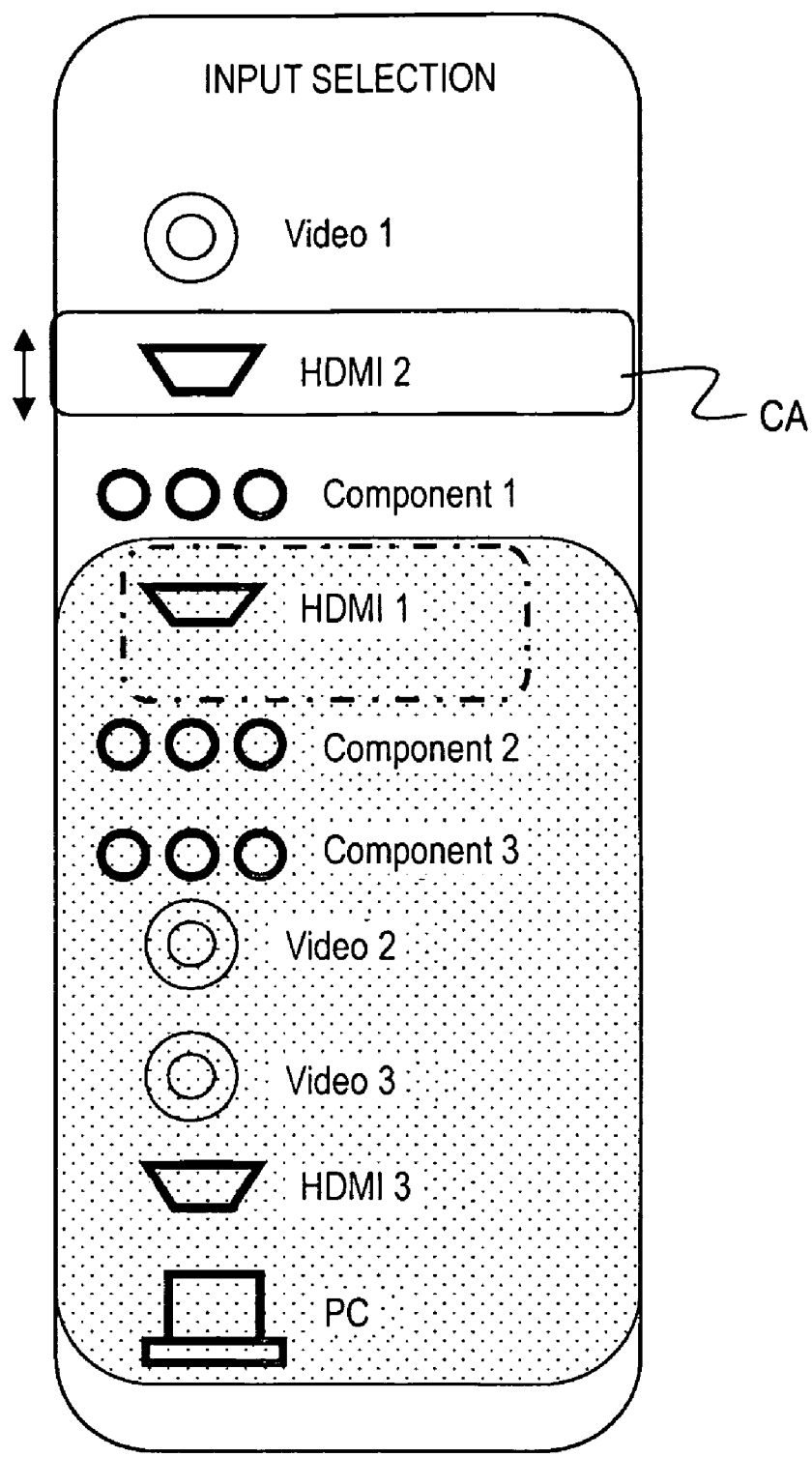
FIG. 19 is a view for explaining connector indications displayed on the display panel at the time of selecting an external input.

Next, when the automatic input detection is set to ON as well as the HDMI active detection is set to ON, connector indications to be displayed on the display panel 113 at the time of selecting the external input are, for example, as shown in FIG. 19. However, in this case, the BD recorder 171 connected to the HDMI connector 101a is in a state of power OFF, namely, is not in the active state.

In this case, connector indications ("HDMI 2", "Component 1" and "Video 1") indicating connectors to which cables are connected (connectors to which active-state devices are connected concerning the HDMI connectors) are displayed in different appearances, for example, in tone, hue, shape and the like, from connector indications ("HDMI 1", "HDMI 3", "Component 2", "Component 3", "Video 2", "Video 3" and "PC") indicating connectors to which cables are not connected (connectors to which cables are not connected or active-state devices are not connected concerning the HDMI connectors).

The connector indication "HDMI 1" indicating the HDMI connector 101a to which the cable is connected but the active-state device is not connected is displayed in a different appearance from the other connector indications indicating connectors to which cables are not connected. In the shown example, "HDMI 1" is surrounded by a dashed-line frame, which is distinguished from other connector indications indicating connectors to which connectors are not connected. According to the distinction, the user can recognize that the cable is connected to the HDMI connector 101a but the connected device is not in the active state.

In this state, the user moves the cursor CA to a desired position of connector indications by the user operation unit 106, for example, by operating the remote controller and determines the position, thereby switching input to the desired connector. In this case, appearances of connector indications are different according to connection/disconnection of cables, therefore, the user can recognize connection/disconnection of cables to respective connectors on the screen of the display panel 113, and further, the user can recognize connection/disconnection of devices in the active state concerning the HDMI connectors, which prevents futile selection operation such as selecting connector indications indicating connectors to which cables are not connected, or connector indications indicating connectors to which devices not in the active state are connected concerning the HDMI connectors.

When the device to be connected to each connector of the TV receiver 100 complies with CEC, the TV receiver 100 can recognize the presence of the device. It can be considered that the recognition information is used at the time of selecting the external input described above. For example, when the user moves the cursor CA to a desired position of desired connector indications by the user operation unit 106, for example, the remote-control operation and performs display operation of the connection device in that state, the control unit 105 displays device indications indicating devices connected to the connector in relation to connector indications indicating the connector as shown in FIG. 20.

Figure 20:
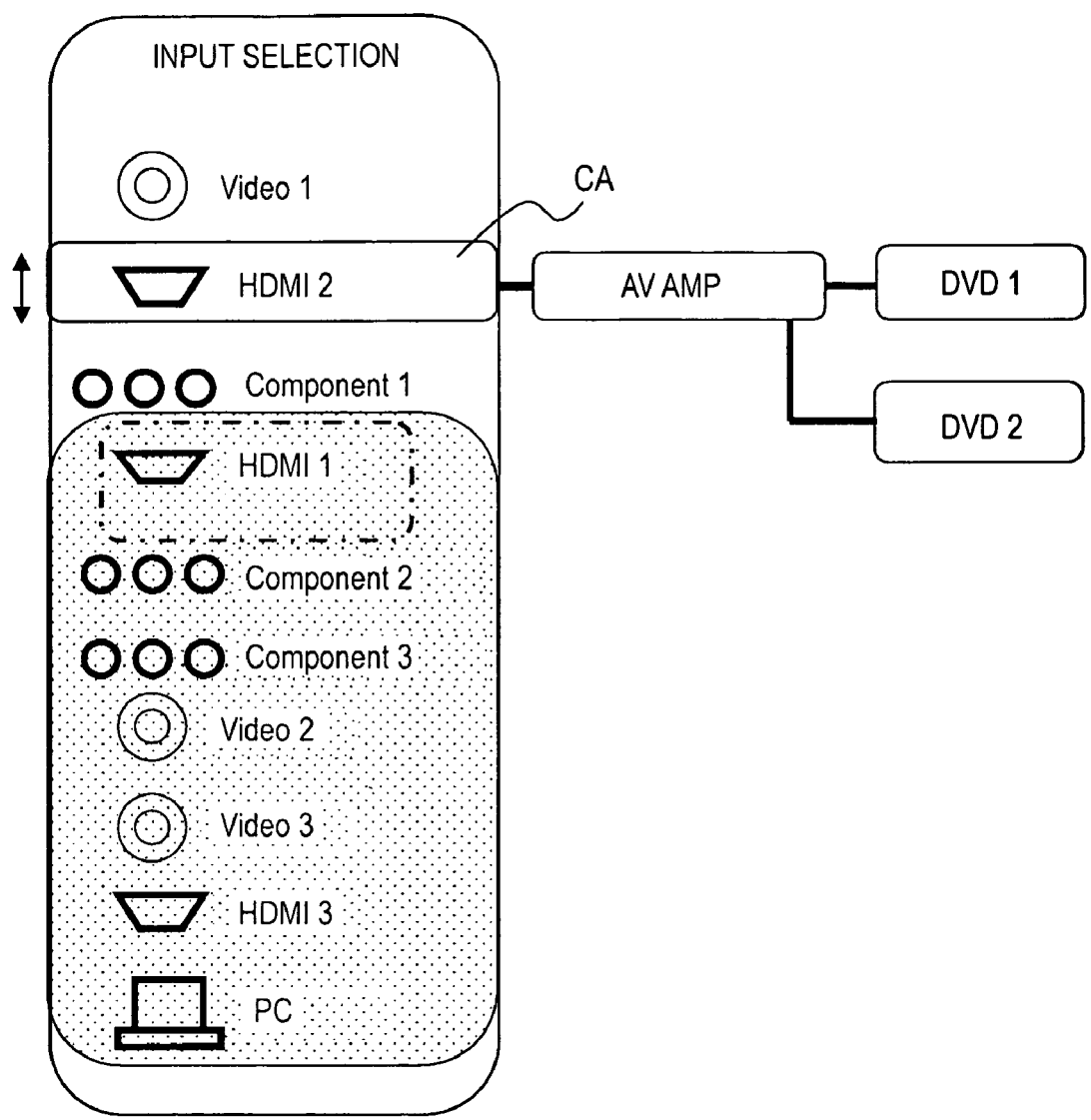
FIG. 20 is a view for explaining connector indications displayed on the display panel at the time of selecting an external input.

In an example of FIG. 20, device indications indicating connected devices are displayed in a tree-structure, however, the display form is not limited to this. Accordingly, the device indications indicating devices connected to the connector are displayed in relation to the connector indications, therefore, the user can check devices connected to each connector on the screen of the display panel 113, which improves operationality in switching operation of the external input.

As described above, in the TV receiver 100 shown in FIG. 1, the appearance of connector indications indicating respective connectors displayed on the display panel 113 is changed according to the detection result of connection/disconnection of cables of respective connector, further, the determination result of connection/disconnection of devices in the active state to the HDMI connectors at the time of selecting the external input, therefore, the user can check connection/disconnection of cables to respective connectors as well as connection/disconnection of devices in the active state to the HDMI connectors easily, which improves selection operationality of the external input.

In the TV receiver 100 shown in FIG. 1, the cable detection circuits 115 (115a, 115b, 115c) are connected to the HDMI connectors 101 (101a to 101c), therefore, connection/disconnection of cables to the HDMI connectors 101 can be detected in good condition. The cable detection circuit 115 outputs the step waveform signal to the HDMI connector 101, detecting connection/disconnection of the cable to the connector based on the reflected signal of the step waveform signal. There is less danger of failure as well as cost increase can be suppressed in this system as compared with the case in which a cable detection mechanism such as a detection switch is added to the HDMI connector 101.

In the TV receiver 100 of FIG. 1, the cable detection circuit 115 is provided by itself, however, it is also preferable to apply a configuration in which the circuit is incorporated in an HDMI receiving unit 108 configured as a semiconductor integrated circuit (IC), or an equalizer (not shown) and the like. For example, in the HDMI receiving unit 108 in which the cable detection circuit 115 is incorporated, signal transmission and reception operations can be performed only when the HDMI cable 150 is connected to the HDMI connector 101.

It can also be considered that the cable detection circuit 115 shown in FIG. 6 is provided at the DVD recorder and the like included in the source device. In this case, the source device can determine whether the HDMI cable is connected to the HDMI connector or not by using the cable detection circuit 115. Therefore, the source device can determine whether topology of CEC is effective or not even when the sink device is in a standby state and voltage of the HPD line is in a low level, as a result, CEC operation can be performed in good condition.

The cable detection circuit 115 shown in FIG. 6 detects connection/disconnection of the HDMI cable 150 to the HDMI connector 101. However, the cable detection circuit which is similar to the cable detection circuit 115 is effective with respect to external interfaces including transmission lines in which impedance is controlled as in the HDMI, for example, DVI, DisplayPort, USB, Ethernet, analog Video/Audio and the like.

2. Second Embodiment

[Configuration Example of a Communication System Between ICS]

FIG. 21A and FIG. 21B show configuration examples of a communication system 200 according to an embodiment. The communication system 200 includes a transmission IC 200A and a receiving IC 200B. An output terminal 201A of the transmission IC 200A is connected to an input terminal 201B of the receiving IC 200B through a cable 210 such as LVDS (Low Voltage Differential Signaling). FIG. 21A shows an example of a short cable 210 and FIG. 21B shows an example of long cable 210.

The transmission IC 200A includes a cable detection circuit 202A. The cable detection circuit 202A detects the length of the cable 210 connected to the output terminal 201A. The details of the cable detection circuit 202A will be described later.

The transmission IC 200A detects the length of the cable 210 by the cable detection circuit 202A, thereby adjusting a transmission signal level to the optimum level according to the length, which can reduce unnecessary radiation as well as save power consumption.

[Configuration Example of the Cable Detection Circuit]

Figure 22:
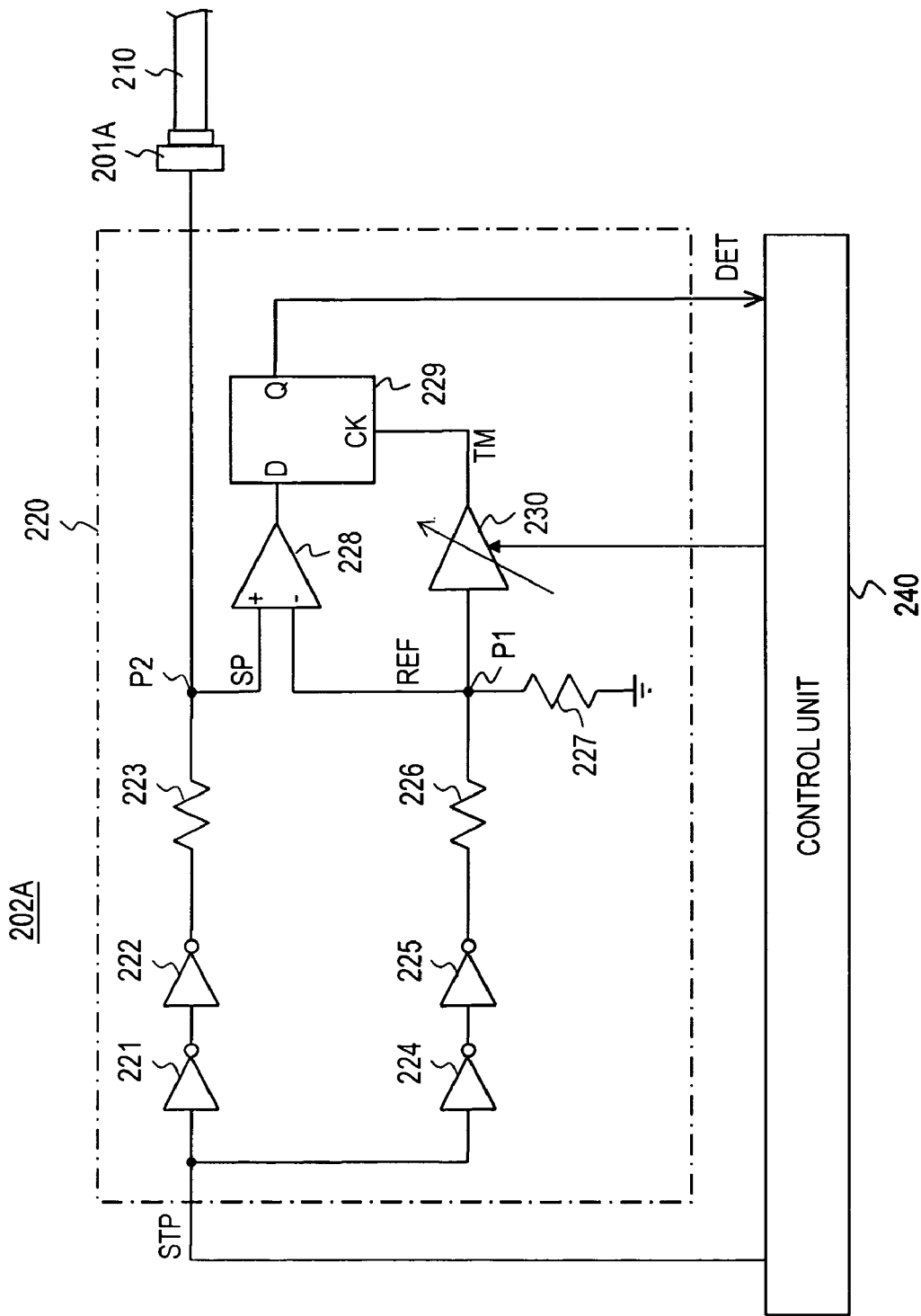
FIG. 22 is a connection diagram showing a configuration example of a cable detection circuit for detecting the cable length.

FIG. 22 shows a configuration example of the cable detection circuit 202A. The cable detection circuit 202A includes a detection unit 220 and a control unit 240. The detection unit 220 includes inverters 221, 222, 224, 225, an output resistance 223, a dummy output resistance 226, a measurement transmission line reference load 227, a comparator 228, a D flip-flop 229 and a delay circuit 230.

The inverters 221, 222 are connected in series, forming a waveform shaping circuit. The inverters 224, 225 are also connected in series, forming a waveform shaping circuit. To the input side of the inverters 221, 222 connected in series and to the input side of the inverters 124, 125 connected in series, a step waveform signal STP is inputted from the control unit 240 at the time of detecting the cable length. The step waveform signal STP has rising time of approximately 2 ns as shown in FIG. 7 described above.

The output side of the inverters 221, 222 connected in series is connected to an output terminal 201A through the output resistance 223. A resistance value of the output resistance 223 is an impedance standard value of cable 210 as the transmission line. The inverters 221, 222 connected in series and the output resistance 223 form a signal output unit.

The output side of the inverters 224, 225 connected in series is grounded through the series circuit of the dummy output resistance 226 and the measurement transmission line reference load 227. The dummy output resistance 226 is a resistance, and a resistance value thereof is an impedance standard value of the cable 210 as the transmission line. The measurement transmission line reference load 227 is a resistance, and a resistance value thereof is a value which is a given amount (+α) higher than the upper limit of the impedance standard value of the cable 210 as the transmission line.

At a connection point P1 between the dummy output resistance 226 and the measurement transmission line reference load 227, a comparison reference signal REF is obtained, which has a value obtained by attenuating the maximum value of the step waveform signal STP by a fixed attenuation rate. The fixed attenuation rate is determined by resistance values of the output resistance dummy 226 and the measurement transmission line reference load 227. The fixed attenuation rate may be at least an attenuation rate in which a value between the value of the signal SP to which a reflected signal is added and the value of the signal SP to which the reflected signal is not added can be obtained as the comparison reference signal REF. Therefore, the resistance values of the dummy output resistance 226 and the measurement transmission line reference load 227 are not limited to the above values.

The signal SP obtained at a connection point P2 (output side of the signal output unit) between the resistance 223 and the output terminal 201 is inputted to a positive-side input terminal of the comparator 228. The comparison reference signal REF obtained at the connection point P1 between the dummy output resistance 226 and the measurement transmission line reference load 227 is inputted to a negative-side input terminal of the comparator 228. The comparator 228 outputs "1" when the signal SP is higher than the comparison reference signal REF, and outputs "0" when the signal SP is lower than the comparison reference signal REF. The output signal of the comparator 228 is inputted to a D terminal of the D flip-flop 229. Here, the comparator 228 and the D flip-flop 229 form a latched comparator.

The delay circuit 230 delays the comparison reference signal REF obtained at the connection point P1 between the output resistance dummy 226 and the measurement transmission line reference load 227 and outputs the signal, generating a timing signal TM at a point delayed from the rising point of the step waveform signal STP by a given period of time. The delay circuit 230 can change the above given period of time (delay time) in stages under the control of the control unit 240. The timing signal TM is supplied to a clock terminal CK of the D flip-flop 229 as a latch signal. Here, the delay circuit 230 forms a timing signal generation unit.

At a Q terminal of D flip-flop 229, an output of the comparator 228 is latched by the timing signal TM generated by the delay circuit 230 and outputted. The Q-terminal output of the D flip-flop 229 is supplied to the control unit 240 as a detection output DET.

At the time of detecting the cable length, the control unit 240 inputs the step waveform signal STP to the detection unit 220 as well as determines the length of the cable 210 based on the detection output DET supplied from the detection unit 220.

Figure 23:
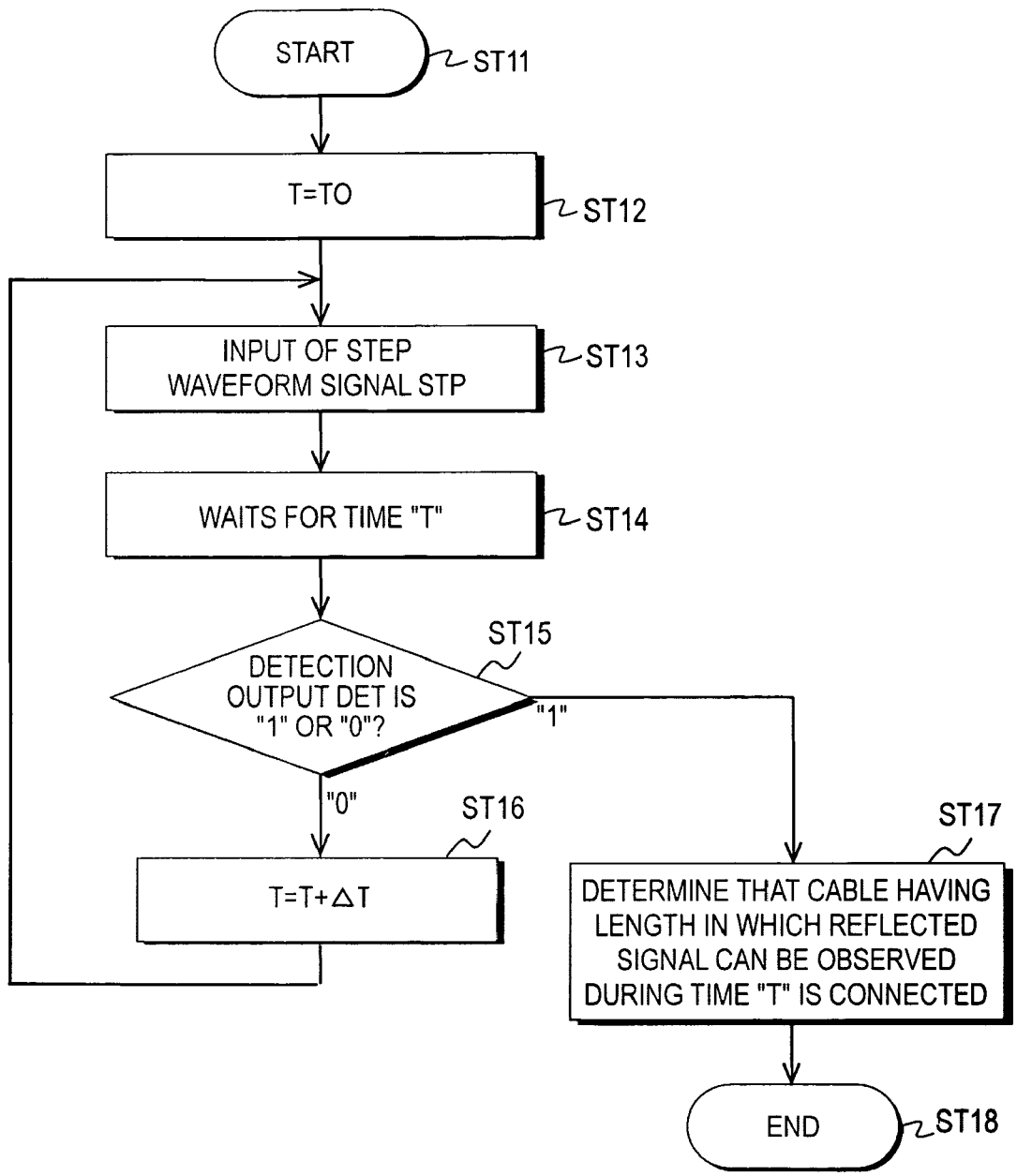
FIG. 23 is a flowchart showing an example of a processing procedure of a control unit at the time of detecting the cable length.

A flowchart of FIG. 23 shows an example of a processing procedure of the control unit 240 at the time of detecting the cable length. The control unit 240 starts processing in Step ST11, and sets a delay time "T" of the delay circuit 230 to an initial value "T0" in Step ST12. For example, when the length of the cable 210 is 50 cm, the initial value "T0" is set to 5 ns which is waiting time from the rising point of the step waveform signal STP until the reflected signal can be observed.

Next, the control unit 240 generates the step waveform signal STP and inputs the signal to the detection unit 220 in Step ST13. Then, the control unit 240 waits for the time "T" in Step ST14, after that, proceeds to processing of Step ST15. In Step ST15, the control unit 240 determines whether the detection output DET is "1" or "0".

When the detection output DET is "0", the control unit 240 determines that the cable 210 is longer than the length in which the reflected signal can be observed during the waiting time "T", and extends the delay time "T" of the delay circuit 230 by ΔT in Step ST16, after that, the control unit 240 returns to processing of Step ST13. Here, ΔT is time for phased length determination. For example, the length determination of the cable 210 is increased in increments of 50 cm, ΔT will be 5 ns.

When the detection output DET is "1" in Step ST15, the control unit 240 proceeds to processing of Step ST17. In Step ST17, the control unit 240 determines that the length of the cable 210 is the length in which the reflected signal can be observed during the time "T", after that, ends the processing Step ST18.

Figure 24:
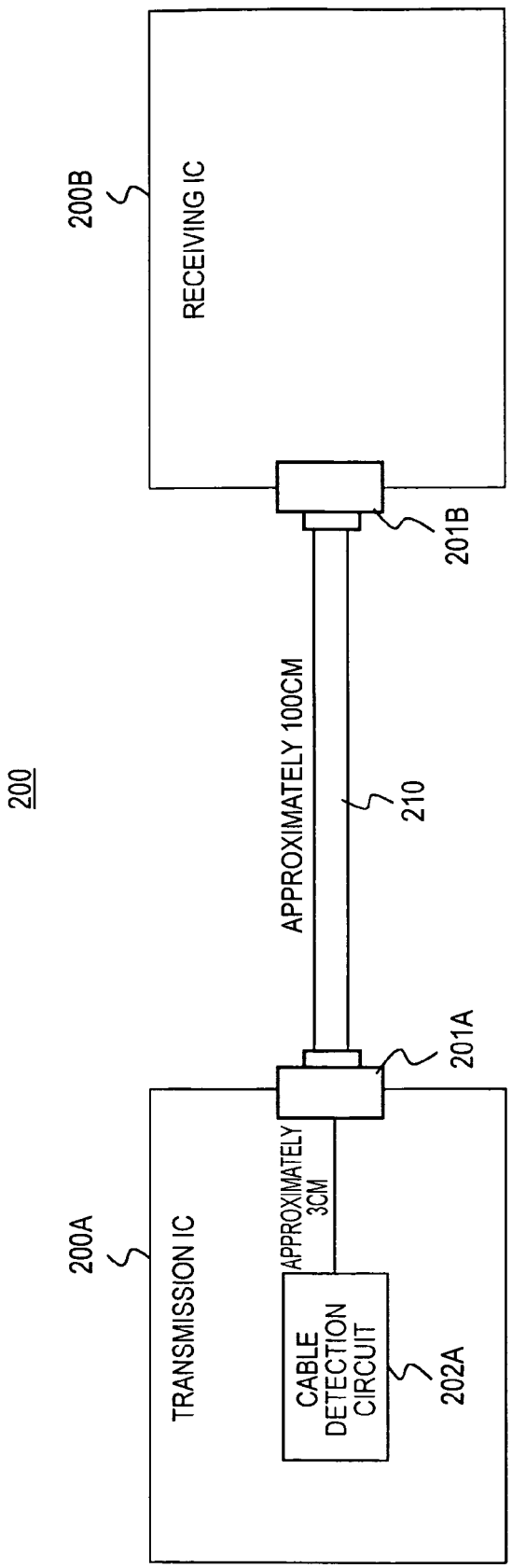
FIG. 24 is a diagram showing an example of a cable connection state (a cable of approximately 100 cm is connected) for explaining an operation example of the cable detection circuit.

An operation example of the cable detection circuit 202A shown in FIG. 22 will be explained. As shown in FIG. 24, assume that the cable 210 is approximately 100 cm, "T0" is set to 5 ns and ΔT is set to 5 ns. The length of the signal line from the cable detection circuit 202A to the output terminal 201A is approximately 3 cm.

Figure 25:
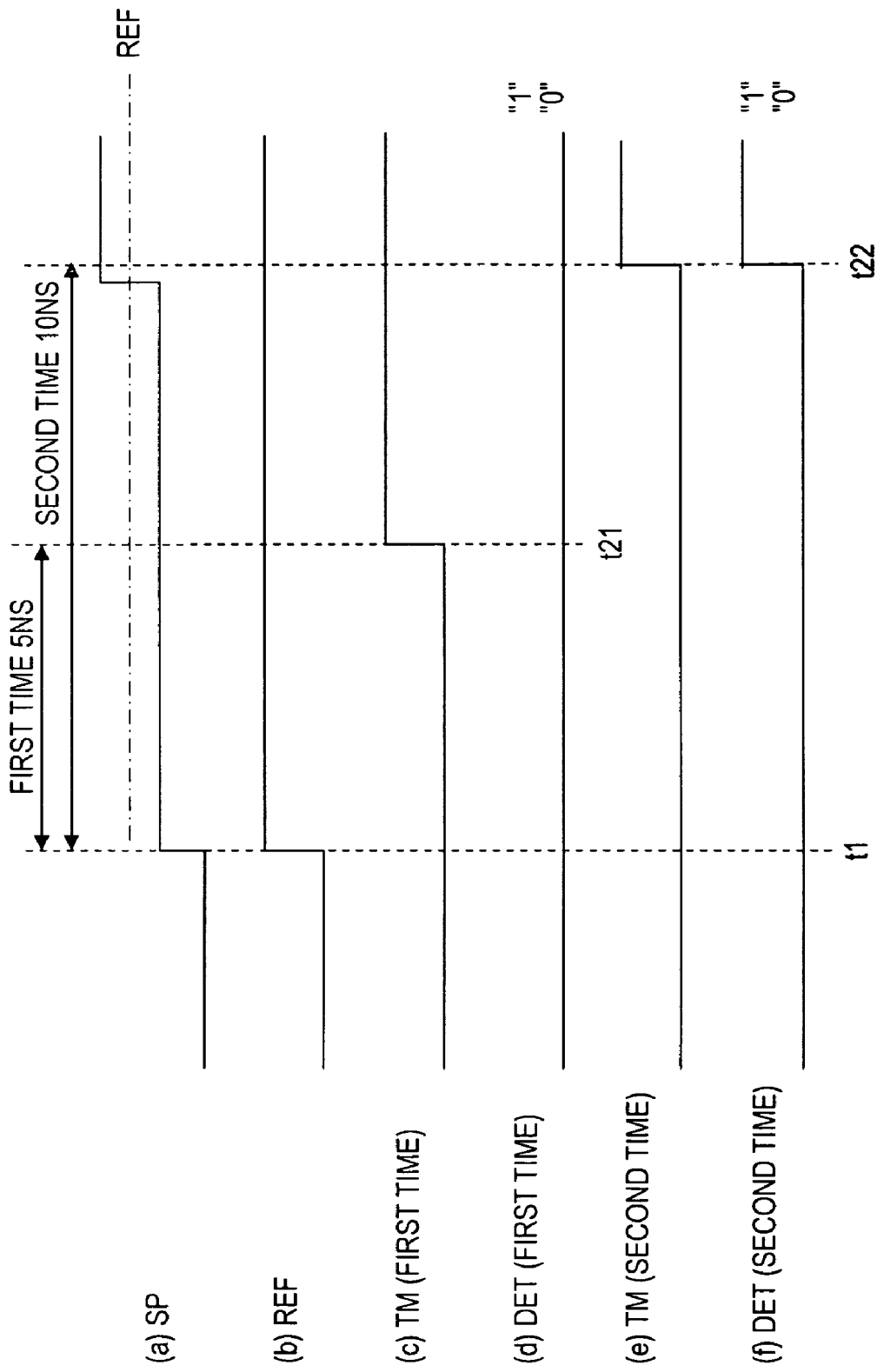
FIG. 25 is a timing chart showing signal waveforms of respective units of the cable detection circuit in the case that the cable of approximately 100 cm is connected.

FIG. 25 shows signal waveforms of respective units in that case. That is, (a) in FIG. 25 represents the signal SP, (b) in FIG. 25 represents the comparison reference signal REF. In this case, impedance is matched in the substrate as well as in the cable 210 after the step waveform signal STP is inputted, therefore, the signal SP is lower than the comparison reference signal REF until just before a point when ns has passed from the rising point "t1" of the step waveform signal STP.

Since the initial value "T0" of the delay time "T" in the delay circuit 230 is 5 ns, the timing signal TM at the first time rises at a point "t21" when 5 ns has passed from the rising point "t1" of the step waveform signal STP as shown in (c) in FIG. 25. At the point "t21", the signal SP is lower than the comparison reference signal REF, and the output of the comparator 228 is "0". Therefore, the detection output DET obtained by the output of the comparator 228 being latched by the timing signal TM at the time is "0" as shown in (d) in FIG. 25, and the second detection processing is performed.

Since the ΔT is 5 ns, the delay time "T" of the delay circuit 230 at the second time is 10 ns, and the timing signal TM at the second time rises at a point "t22" when 10 ns has passed from the rising point "t1" of the step waveform signal STP as shown in (e) in FIG. 25. At the point "t22", the signal SP is higher than the comparison reference signal REF, and the output of the comparator 228 is "1". Therefore, the detection output DET obtained by the output of the comparator 228 being latched by the timing signal TM at the second time is "1" as shown in (f) in FIG. 25. Accordingly, the control unit 240 determines that the length of the cable 210 connected to the output terminal 201A as the length in which the reflected signal can be observed in the time "T"=10 ns, namely, the length longer than 50 cm as well as shorter than 100 cm.

In the above description, the initial value "T0" of the delay circuit 230 is 5 ns, however, when the initial value "T0" is set to be shorter than 5 ns, the length of the cable 210 can be detected even when the length is shorter than 50 cm. Also in the above description, ΔT is 5 ns, however, when ΔT is set to be shorter than 5 ns, the length of the cable 210 can be detected with higher accuracy than 50 cm.

Also in the above description, the length of the cable 210 is detected by setting the initial value "T0" of the delay time "T" in the delay circuit 230 to be short and extending the delay time "T" in stages in increments of ΔT until the detection output DET becomes in the state of "1" from the state of "0". However, it is also preferable that the length of the cable 210 is detected by setting the initial value "T0" of the delay time "T" in the delay circuit 230 to be long, and shortening the delay time "T" in stages in increments of ΔT until the detection output DET becomes in the state of "0" from the state of "1".

3. Third Embodiment
[Configuration Example of a Memory Circuit]

Figure 26:
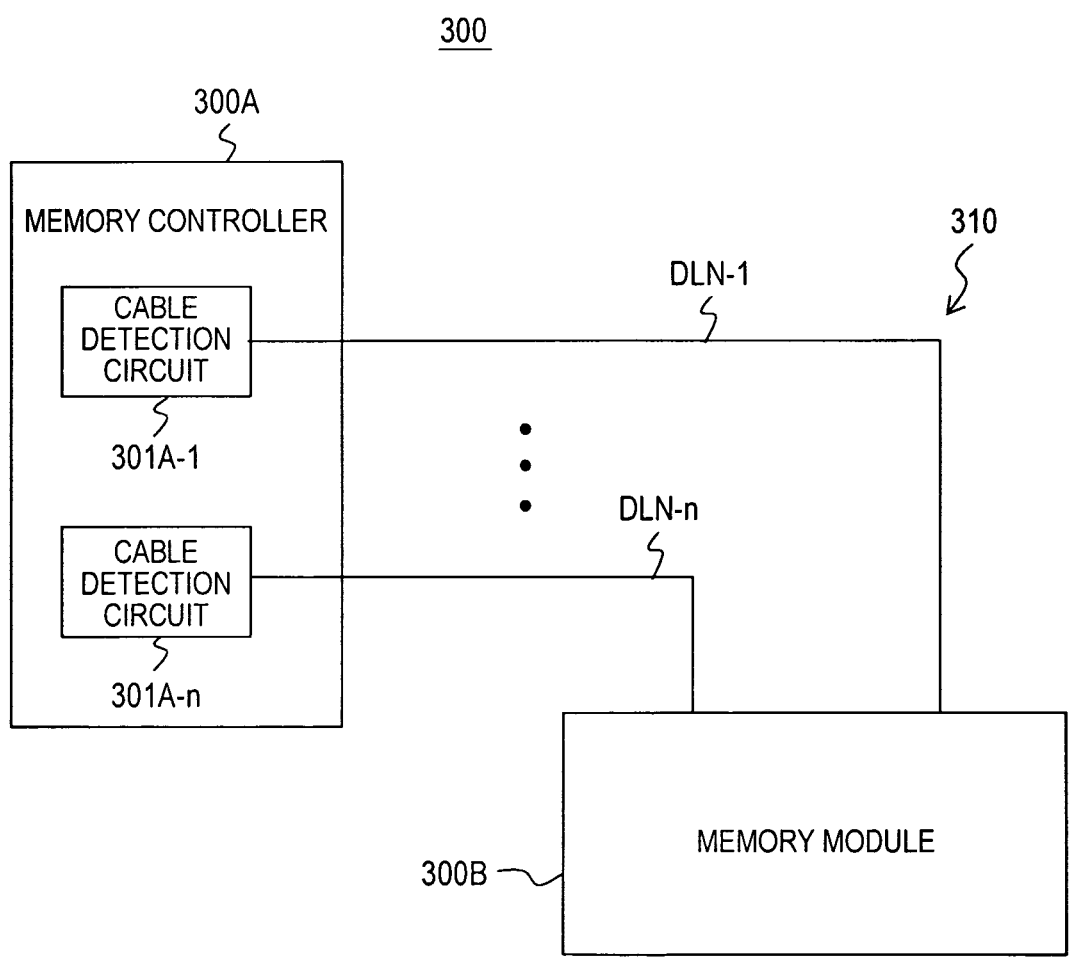
FIG. 26 is a block diagram showing a configuration example of a memory circuit according to a third embodiment of the invention.

FIG. 26 shows a configuration example of a memory circuit 300. The memory circuit 300 includes a memory controller 300A and a memory module 300B. A bus line 310 having plural data lines DLN-1 to DLN-n is arranged between the memory controller 300A and a memory module 300B. The bus line 310 forms a memory interface.

The memory controller 300A includes plural cable detection circuits 301A-1 to 301A-n so as to correspond to the plural data lines DLN-1 to DLN-n. Though the detailed description of the cable detection circuits 301A-1 to 301A-n is omitted but the circuits are configured similar to the cable detection circuit 202A (refer to FIG. 22) in the above second embodiment, which detect lengths of the data lines DLN-1 to DLN-n as transmission lines.

The memory controller 300A detects lengths of the data lines DLN-1 to DLN-n by the cable detection circuits 301A-1 to 301A-n, thereby recognizing the difference of pattern lengths of these plural data lines DLN-1 to DLN-n, adjusting data output timing of respective lines and suppressing skew.

Therefore, in the memory circuit 300 of FIG. 26, it is possible to eliminate patterns which have been drawn unnecessarily long for performing same-length wiring from the substrate, which saves the substrate space as well as reduces unnecessary radiation, thereby performing ideal wiring.

The memory controller 300A forming the memory circuit 300 of FIG. 26 includes plural cable detection circuits 301A-1 to 301A-n. However, it is also preferable that only one cable detection circuit is provided and the lengths of the data lines DLN-1 to DLN-n are sequentially detected by the only one cable detection circuit.

In the above configuration, attention is given to the interface in the memory circuit 300, however, it goes without saying that the same technique can be applied to circuit portions on the substrate in which skew between plural lines is also significant.

4. Fourth Embodiment
[Configuration of a Communication System Between ICS]

Figure 27:
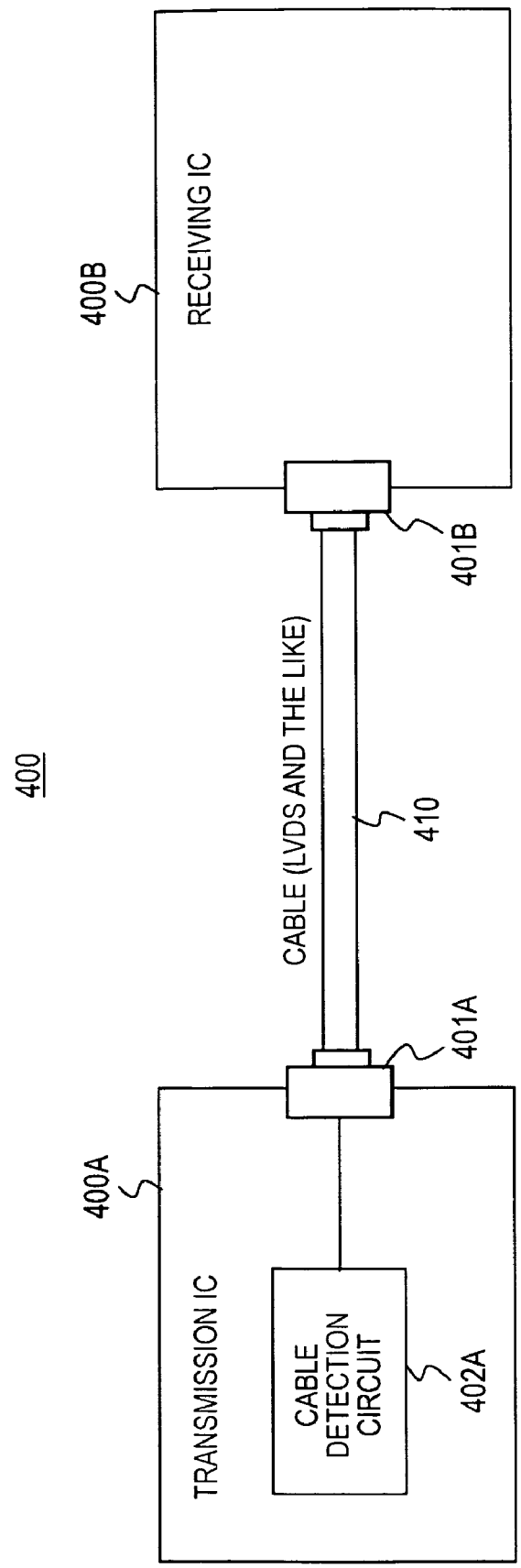
FIG. 27 is a block diagram showing a configuration example of a communication system between ICs according to a fourth embodiment of the invention.

FIG. 27 shows a configuration example of a communication system 400 according to an embodiment. The communication system 400 includes a transmission IC 400A and a receiving IC 400B. An output terminal 401A of the transmission IC 400A is connected to an input terminal 401B of the receiving IC 400B through a cable 410 such as LVDS.

The transmission IC 400A includes a cable detection circuit 402A. The cable detection circuit 402A detects impedance of the cable 410 connected to the output terminal 401A. The details of the cable detection circuit 402A will be described later.

The transmission IC 400A detects impedance of the cable 410 by the cable detection circuit 402A, thereby selecting the optimum output resistance with respect to the cable 410, for example, when a cheap cable in which impedance is not properly controlled is used as the cable 410. Accordingly, it is possible to perform stable transmission by suppressing reflection, which can reduce unnecessary radiation.

[Configuration Example of the Cable Detection Circuit]

Figure 28:
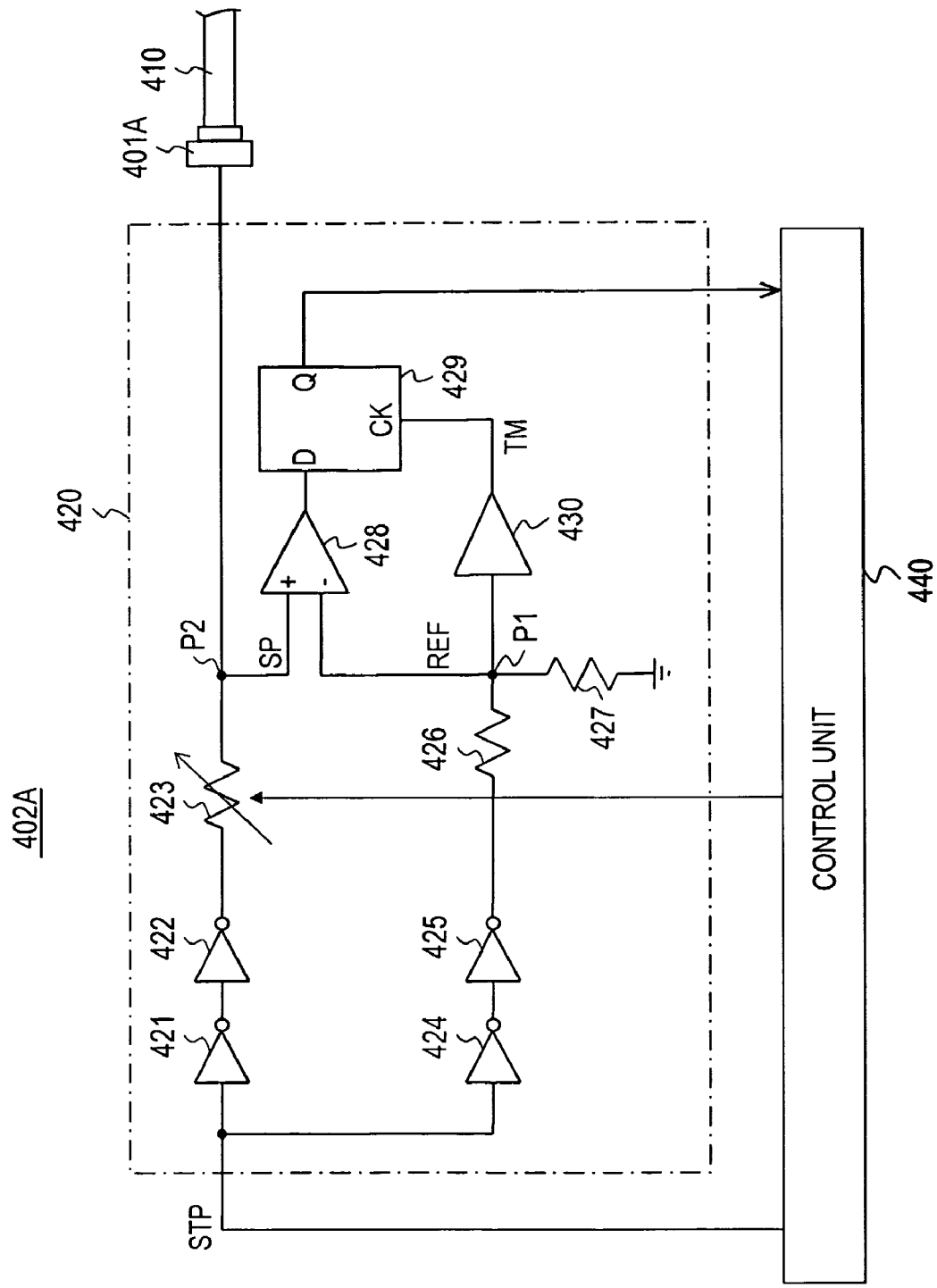
FIG. 28 is a connection diagram showing a configuration example of the cable detection circuit for detecting cable impedance.

FIG. 28 shows a configuration example of the cable detection circuit 402A. The cable detection circuit 402A includes a detection unit 420 and a control unit 440. The detection unit 420 includes inverters 421, 422, 424, 425, an output resistance 423, a dummy output resistance 426, a measurement transmission line reference load 427, a comparator 428, a D flip-flop 429 and a delay circuit 430.

The inverters 421, 422 are connected in series, forming a waveform shaping circuit. The inverters 424, 425 are also connected in series, forming a waveform shaping circuit. To the input side of the inverters 421, 422 connected in series and to the input side of the inverters 424, 425 connected in series, a step waveform signal STP is inputted from the control unit 440 at the time of detecting the cable impedance. The step waveform signal STP has rising time of approximately 2 ns as shown in FIG. 7 described above.

The output side of the inverters 421, 422 connected in series is connected to the output terminal 401A through the output resistance 423. The output resistance 423 can change the resistance value in stages under the control of the control unit 440. Here, the inverters 421, 422 connected in series and the output resistance 423 form a signal output unit.

The output side of the inverters 424, 425 connected in series is grounded through the series circuit of the dummy output resistance 426 and the measurement transmission line reference load 427. The dummy output resistance 426 is a resistance, and a resistance value thereof is estimated impedance (an impedance standard value) of the cable 410 as the transmission line. The measurement transmission line reference load 427 is a resistance, and a resistance value thereof is the estimated impedance (the impedance standard value) of the cable 410 as the transmission line.

At a connection point P1 between the dummy output resistance 426 and the measurement transmission line reference load 427, a comparison reference signal REF is obtained, which has a value obtained by attenuating the maximum value of the step waveform signal STP by a fixed attenuation rate. The fixed attenuation rate is determined by resistance values of the dummy resistance dummy 426 and the measurement transmission line reference load 427. For example, when resistance values of the dummy resistance dummy 426 and the measurement transmission line reference load 427 are both the estimated impedance (impedance standard value), the fixed attenuation rate will be 1/2. The fixed attenuation rate may be the attenuation rate of approximately 1/2. Therefore, the resistance values of the dummy resistance dummy 426 and the measurement transmission line reference load 427 are not limited to the above value.

The signal SP obtained at a connection point P2 (output side of the signal output unit) between the resistance 423 and the output terminal 401A is inputted to a positive-side input terminal of the comparator 428. The comparison reference signal REF obtained at the connection point P1 between the dummy output resistance 426 and the measurement transmission line reference load 427 is inputted to a negative-side input terminal of the comparator 428. The comparator 428 outputs "1" when the signal SP is higher than the comparison reference signal REF, and outputs "0" when the signal SP is lower than the comparison reference signal REF. The output signal of the comparator 428 is inputted to a D terminal of the D flip-flop 429. Here, the comparator 428 and the D flip-flop form a latched comparator.

The delay circuit 430 delays the comparison reference signal REF obtained at the connection point P1 between the output resistance dummy 426 and the measurement transmission line reference load 427 and outputs the signal, generating a timing signal TM at a point delayed from the rising point of the step waveform signal STP by a given period of time. The timing signal TM is supplied to a clock terminal CK of the D flip-flop 429 as a latch signal. The delay time "T" of the delay circuit 430 is set to the optimum time for an impedance measurement point in the cable 410. For example, when a point of 50 cm is desired to be the measurement point, the delay time "T" is set to 5 ns. Here, the delay circuit 430 forms a timing signal generation unit.

At a Q terminal of D flip-flop 429, an output of the comparator 428 is latched by the timing signal TM generated by the delay circuit 430 and outputted. The Q-terminal output of the D flip-flop 429 is supplied to the control unit 440 as a detection output DET.

At the time of detecting the cable impedance, the control unit 440 inputs the step waveform signal STP to the detection unit 420 as well as determines the impedance of the cable 410 based on the detection output DET supplied from the detection unit 420.

Figure 29:
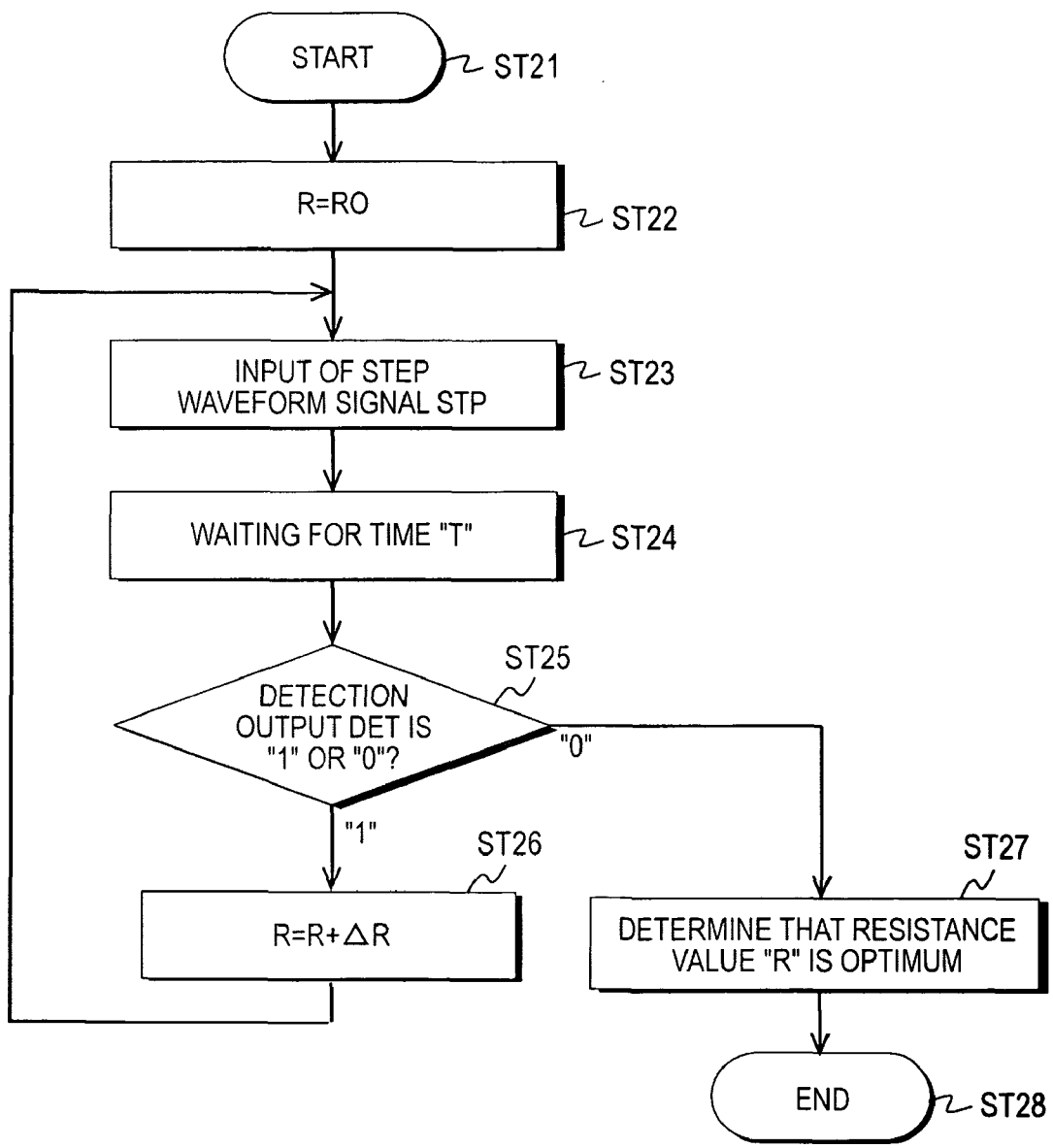
FIG. 29 is a flowchart showing an example of a processing procedure of a control unit at the time of detecting cable impedance.

A flowchart of FIG. 29 shows an example of a processing procedure of the control unit 440 at the time of detecting cable impedance. The control unit 440 starts processing in Step ST21 and sets a resistance value "R" of the output resistance 423 to an initial value "R0" in Step S22. The initial value "R0" is set to a value significantly lower than the estimated impedance (impedance standard value) of the cable 410, for example, a value of approximately ½.

Next, the control unit 440 generates the step waveform signal STP and inputs the signal to the detection unit 420 in Step ST23. Then, the control unit 440 waits for the time "T" in Step ST24, after that, proceeds to processing of Step ST25. In Step ST25, the control unit 440 determines whether the detection output DET is "1" or "0".

When the detection output DET is "1", the control unit 440 determines that impedance of an observation point of the cable 410 is higher than "R", increasing the resistance value "R" of the output resistance 423 by ΔR in Step ST26, after that, the control unit 440 returns to the processing of Step ST23. Here, ΔR is the resistance value for phased determination of size. For example, ΔR is set to a value approximately 1/10 of the estimated impedance (impedance standard value) of the cable 410.

When the detection output DET is "0" in Step ST25, the control unit 440 proceeds to processing of ST27. In Step S27, the control unit 440 determines that the resistance value "R" is optimum as impedance at the observation point of the cable 410, after that, ends the processing in Step ST28.

Figure 30:
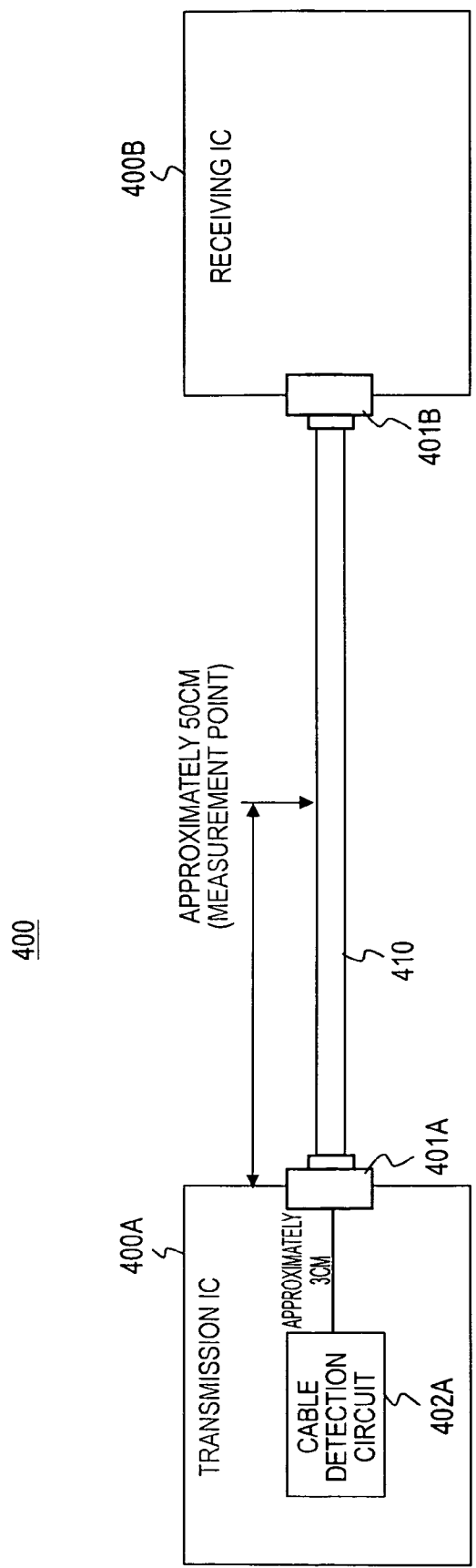
FIG. 30 is a diagram showing an example of the cable connection state (a measurement point is approximately 50 cm) for explaining an operation example of the cable detection circuit.

An operation example of the cable detection circuit 402A shown in FIG. 28 will be explained. As shown in FIG. 30, assume that a point of approximately 50 cm in the cable 410 is a measurement point, and delay time "T" is set to 5 ns.

Figure 31:
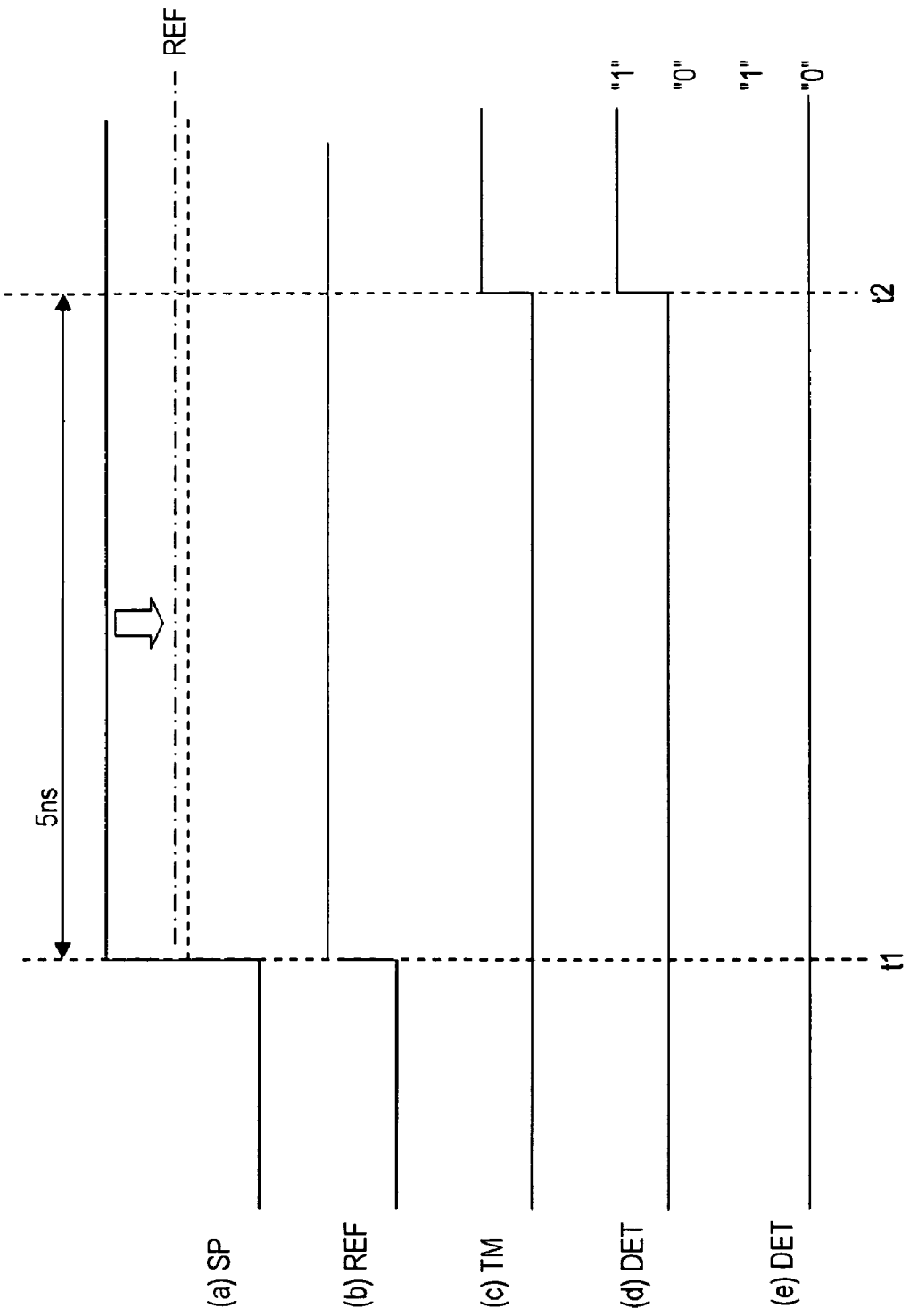
FIG. 31 is a timing chart showing signal waveforms of respective units of the cable detection circuit in the case that the measurement point is approximately 50 cm.

FIG. 31 shows signal waveforms of respective units in that case. That is, (a) in FIG. 31 represents the signal SP, (b) in FIG. 31 represents the comparison reference signal REF. The initial value "R0" of the output resistance "R" is set to a value significantly lower than the estimated impedance (impedance standard value) of the cable 410, therefore, the signal SP is higher than the comparison reference signal REF at first as shown in (a) in FIG. 31 in a solid line after the step waveform signal STP is inputted.

Since the initial value "T0" of the delay time "T" of the delay circuit 430 is 5 ns, the timing signal TM rises at a point "t2" after 5 ns has passed from the rising point "t1" of the step waveform signal STP as shown in (c) in FIG. 31. At the point "t2", the signal SP is higher than the comparison reference signal REF, and the output of the comparator 428 is "1". Therefore, the detection output DET obtained by the output of the comparator 428 being latched by the timing signal TM is "1" as shown in (d) in FIG. 31, and detection processing of the next stage is performed.

In the detection processing of the next stage, the resistance value "R" of the output resistance is obtained by adding ΔR. Accordingly, the level of the signal SP after the step waveform signal STP is inputted is reduced. In this stage, when the level of the signal SP is higher than the comparison reference signal REF at the point "t2" of the timing signal TM, the detection output DET is "1", and further next detection processing is performed.

After that, the same processing is performed repeatedly, and the signal SP after the step waveform signal STP is inputted is lower than the comparison reference signal REF in detection processing at a certain stage as shown in (a) in FIG. 31 by a broken line. In this case, the signal SP is lower than the comparison reference signal REF at the point "t2" of the timing signal TM, and the output of the comparator 428 is "0". Therefore, the detection output DET obtained by the output of the comparator 428 being latched by the timing signal TM is "0" as shown in (e) in FIG. 31. Accordingly, the control unit 440 determines that the resistance value "R" is optimum for impedance of the observation point of the cable 410 connected to the output terminal 401A.

In the above description, the point of approximately 50 cm is the observation point when the delay time "T" of the delay circuit 230 is 5 ns, however, another point can be the observation point by setting the delay time "T" to another value. Additionally, in the above description, ΔR is set to be the value approximately 1/10 of the estimated impedance (impedance standard value) of the cable 410, however, more precise detection can be performed by setting ΔR to a lower value.

Also in the above description, impedance of the cable 410 is detected by setting the resistance value "R" of the output resistance 423 to a low value at first, then, by increasing the resistance value "R" in stages in increments of ΔR so that the detection output DET becomes in the state of "0" from the state of "1". However, it is also preferable that the resistance value "R" of the output resistance 423 is set to a high value at first, then, by reducing the resistance value "R" in stages in increments of ΔR so that the detection output DET becomes in the state of "1" from the state of "0".

5. Modification Example

[Step Waveform Signal Generation Unit]

Figure 32:
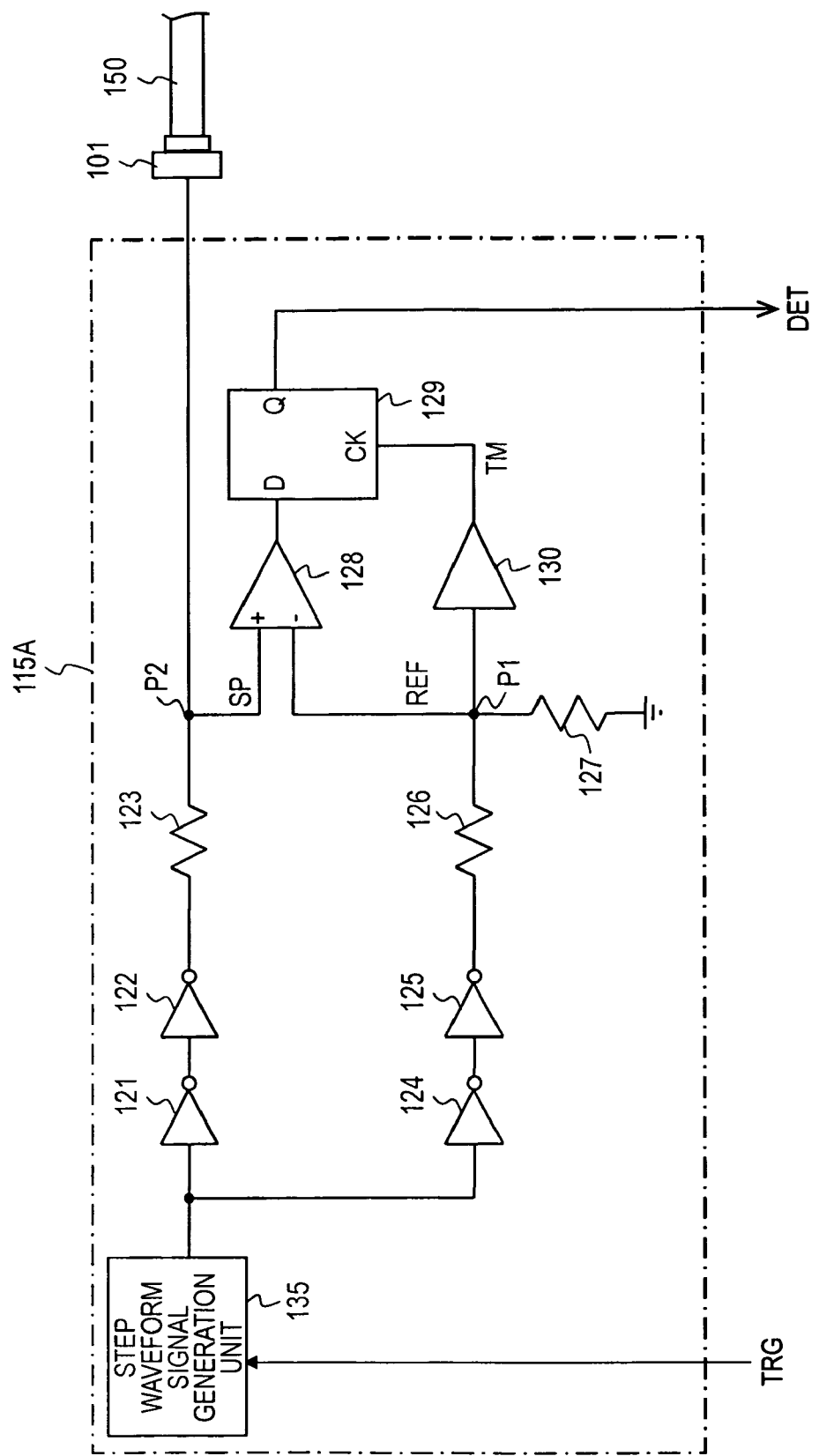
FIG. 32 is a block diagram showing another configuration example of the cable detection circuit.

The cable detection circuit 115 (115a to 115c) shown in FIG. 6, which is included in the TV receiver 100 according to the above first embodiment does not include a step waveform signal generation unit, and the step waveform signal STP is inputted from the control unit 105 at the time of detecting connection/disconnection. However, it is also preferable that a cable detection circuit 115A including a step waveform signal generation unit 135 is used instead of the cable detection circuit 115 as shown in FIG. 32.

In the cable detection circuit 115A, the step waveform signal STP generated by the step waveform signal generation unit 135 is inputted to the series circuit of inverters 121, 122 as well as the series circuit of inverters 124, 125. Other configurations of the cable detection circuit 115A are the same as the cable detection circuit 115, though the detailed explanation is omitted.

The step waveform signal generation unit 135 of the cable detection circuit 115A is instructed to generate the step waveform signal STP by a trigger signal TRG or a register writing signal supplied from the control unit 105. It is possible to apply a configuration in which the step waveform signal generation unit 135 voluntarily generates the step waveform signal STP without instruction on generation of the step waveform signal STP by the control unit 105.

[Comparison Reference Signal]

Figure 33:
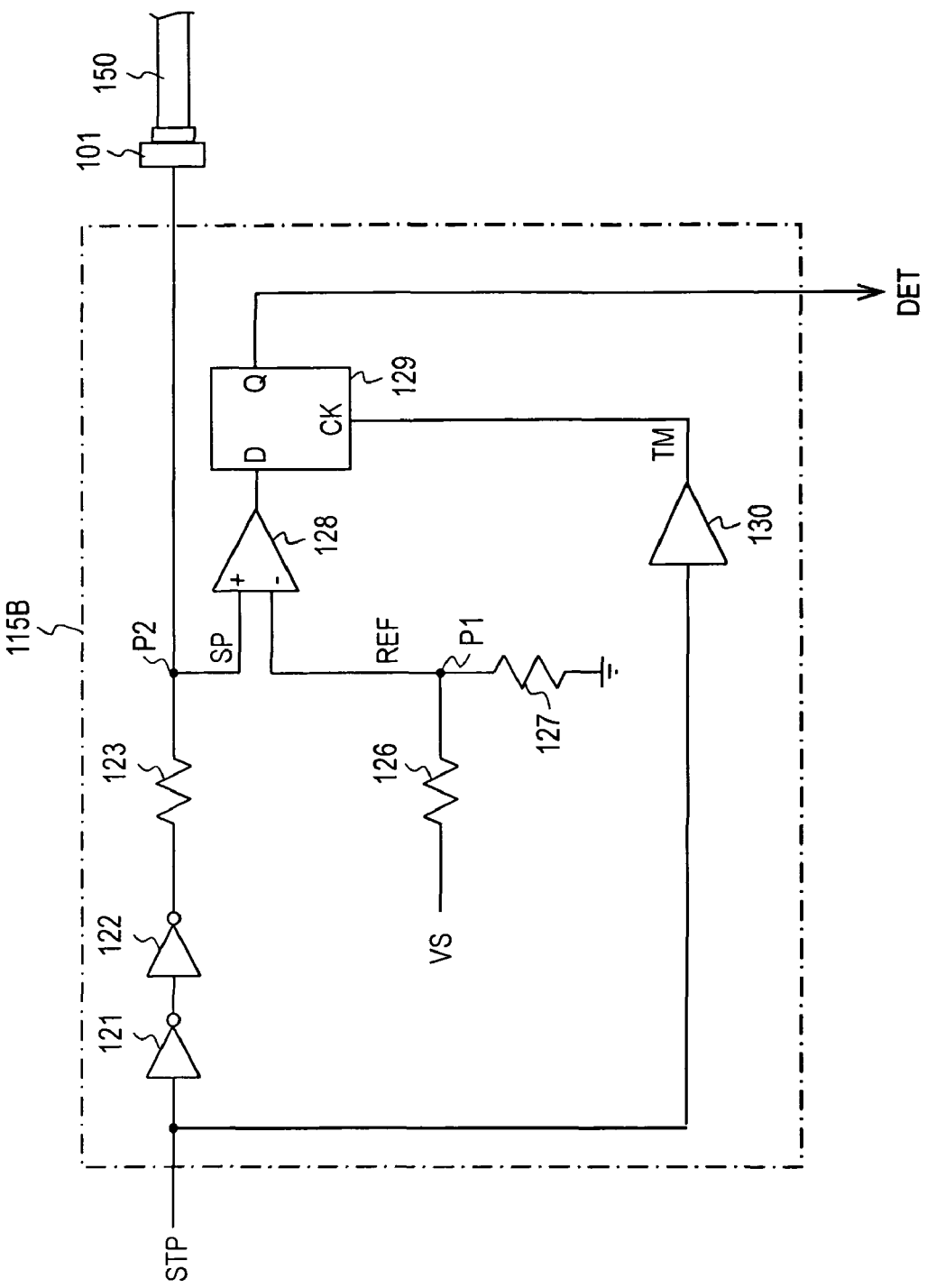
FIG. 33 is a block diagram showing another configuration example of a cable detection circuit.

The cable detection circuit 115 (115a to 115c) shown in FIG. 6, which is included in the TV receiver 100 according to the above first embodiment has a configuration in which the comparison reference signal REF is generated by dividing the step waveform signal STP by the dummy output resistance 126 and the measurement transmission line reference load 127. However, it is also preferable to apply a cable detection circuit 115B being used instead of the cable detection circuit 115, in which the comparison reference signal REF is generated by dividing the maximum value VS (voltage value after rising) of the step waveform signal STP by the dummy output resistance 126 and the measurement transmission line reference load 127 as shown in FIG. 33.

In the cable detection circuit 115B, the step waveform signal STP which is inputted to the cable detection circuit 115B from the control unit 105 is supplied to an input side of the delay circuit 130. It is also preferable that the step waveform signal STP after the waveform shaping obtained at the output side of the inverter 122 is inputted to the delay circuit 130. Other configurations of the cable detection circuit 115B are the same as the cable detection circuit 115, though the detailed explanation is omitted.

In the detection unit 220 of the cable detection circuit 202A shown in FIG. 22 and in the detection circuit 420 of the cable detection circuit 402A shown in FIG. 28, the comparison reference signal REF is generated by dividing the step waveform signal STP by the dummy output resistances 226, 426 and the measurement transmission line reference loads 227, 427. However, concerning these circuits, it is also possible to generate the comparison reference signal REF by dividing the maximum value (voltage value after rising) VS of the step waveform signal STP by the dummy output resistance and the measurement transmission line reference load in the same manner as the cable detection circuit 115B shown in FIG. 33.

According to an embodiment of the invention, it is possible to check connection/disconnection of cables to connectors on a screen easily, which can be applied to video display devices such as a TV receiver including the connectors such as HDMI connectors, to which the cables transmitting video signals are connected. According to an embodiment of the invention, connection/disconnection of a transmission line to a connection portion, the length of the transmission line connected to the connection portion and a transmission line state such as impedance of the transmission line connected to the connection portion can be detected in good condition, which can be applied to a transmission IC, a memory system and the like.

It should be understood by those skilled in the art that various modifications, combinations, sub-combinations and alterations may occur depending on design requirements and other factors insofar as they are within the scope of the appended claims or the equivalents thereof.

What is claimed is:

1. A video display device comprising:
   connectors to which cables transmitting video signals are connected;
   a display panel displaying video by the video signal inputted to the connector from an external device through the cable;
   a display control unit displaying connector indications indicating the connectors on the display panel;
   a cable detection unit outputting a step waveform signal having a rising time of approximately 2 nanoseconds to the connector and detecting connection/disconnection of the cable to the connector based on a reflected signal of the step waveform signal, and
   wherein the display control unit changes the appearance of the connector indications displayed on the display panel according to a detection output of the cable detection unit,
   the step waveform signal being coupled to a multiple of waveform shaping circuits, at least one of the waveform shaping circuits comprising a dummy output resistance and a reference load, the values of the dummy output resistance and the reference load being selected to set a maximum margin for cable detection.

2. The video display device according to claim 1,
wherein the cable detection unit includes
- a signal output unit outputting the step waveform signal to the connector through an output resistance having a resistance value corresponding to impedance of the transmission line,
- a reference signal generation unit generating a comparison reference signal having a value obtained by attenuating the maximum value of the step waveform signal by a fixed attenuation rate,
- a timing signal generation unit generating a timing signal at a point delayed from a rising point of the step waveform signal by a given period of time, and
- a latched comparator obtaining a detection output by latching a comparison result between a signal obtained at the output side of the signal output unit and the comparison reference signal generated by the reference generation unit by the timing signal generated by the timing generation unit.

3. The video display device according to claim 1,
wherein the connector is a connector for inputting a baseband video signal transmitted from the external device by differential signals in plural channels through the cable.

4. The video display device according to claim 1,
wherein the display control unit displays device indications indicating devices connected to the connector in relation to the connector indications indicating the connectors to which the cables are connected, which are displayed on the display panel.

5. The video display device according to claim 1, further comprising:
- a user operation unit performing input switching by selecting the connector indication displayed on the display panel; and
- a selection limitation unit limiting connector indications which can be selected by the user operation unit to connector indications indicating connectors to which cables are connected according to the detection result of the cable detection unit.

6. The video display device according to claim 5,
wherein the display control unit displays connector indications which can be selected by the user operation unit by gathering the indications together in a given range.

7. The video display device according to claim 5,
wherein the display control unit does not display connector indications indicating connectors to which the cables are not connected on the display panel.

8. The video display device according to claim 1, further comprising:
- an active determination unit determining whether an external device in an active state is connected through the cable or not based on a potential state of a prescribed line of the cable connected to the connector, and
- wherein the display control unit changes the appearance of connector indications displayed on the display panel according to the detected output of the cable detection unit as well as the determination result of the active determination unit.

9. A method of displaying connectors in a video display device including connectors to which cables transmitting video signals are connected and a display panel displaying video by the video signal inputted to the connector from an external device through the cable, the method comprising the steps of:
- displaying connector indications indicating the connectors on the display panel;
- outputting a step waveform signal having a rising time of approximately 2 nanoseconds to the connector and detecting connection/disconnection of the cable to the connector based on a reflected signal of the step waveform signal; and
- changing the appearance of connector indications displayed on the display panel according to the detection result of the step of detecting the cable,
- the step waveform signal being coupled to a multiple of waveform shaping circuits, at least one of the waveform shaping circuits comprising a dummy output resistance and a reference load, the values of the dummy output resistance and the reference load being selected to set a maximum margin for cable detection.

10. A transmission-line state detection device outputting a step waveform signal having a rising time of approximately 2 nanoseconds to a connection portion of a transmission line for performing reception or transmission of a signal and detecting a state of the transmission line based on a reflected signal of the step waveform signal,
- the step waveform signal being coupled to a multiple of waveform shaping circuits, at least one of the waveform shaping circuits comprising a dummy output resistance and a reference load, the values of the dummy output resistance and the reference load being selected to set a maximum margin for transmission line status detection.

11. The transmission-line detection device according to claim 10,
wherein the transmission-line state is connection/disconnection of the transmission line to the connection portion, and the device includes
- a signal output unit outputting the step waveform signal to the connector through an output resistance having a resistance value corresponding to impedance of the transmission line,
- a reference signal generation unit generating a comparison reference signal having a value obtained by attenuating the maximum value of the step waveform signal by a fixed attenuation rate,
- a timing signal generation unit generating a timing signal at a point delayed from a rising point of the step waveform signal by a given period of time, and
- a latched comparator obtaining a detection output by latching a comparison result between a signal obtained at the output side of the signal output unit and the comparison reference signal generated by the reference generation unit by the timing signal generated by the timing generation unit.

12. The transmission-line detection device according to claim 10,
wherein the transmission-line state is the length of the transmission line connected to the connection portion, the device includes
- a signal output unit outputting the step waveform signal to the connector through an output resistance having a resistance value corresponding to impedance of the transmission line,
- a reference signal generation unit generating a comparison reference signal having a value obtained by attenuating the maximum value of the step waveform signal by a fixed attenuation rate,
- a timing signal generation unit generating a timing signal at a point delayed from a rising point of the step waveform signal by a given period of time,
- a latched comparator latching a comparison result between a signal obtained at the output side of the signal output unit and the comparison reference signal generated by the reference generation unit by the timing signal generated by the timing generation unit, and
- a control unit extending the given period of time in the timing signal generation unit in stages or shortening the given period of time in stages until an output of the latched comparator changes from one state to another state as well as generating the step waveform signal in each stage.

13. The transmission-line detection device according to claim 10,
wherein the transmission-line state is impedance of the transmission line connected to the connection portion, the device includes
a signal output unit outputting the step waveform signal to the connector through an output resistance,
a reference signal generation unit generating a comparison reference signal having a value obtained by attenuating the maximum value of the step waveform signal by a fixed attenuation rate,
a timing signal generation unit generating a timing signal at a point delayed from a rising point of the step waveform signal by a given period of time,
a latched comparator latching a comparison result between a signal obtained at the output side of the signal output unit and the comparison reference signal generated by the reference generation unit by the timing signal generated by the timing generation unit, and
a control unit increasing a resistance value of the output resistance in the signal output unit in stages or reducing the resistance value in stages until an output of the latched comparator changes from one state to another state as well as generating the step waveform signal in each stage.

14. A transmission-line state detection method comprising the steps of:
outputting a step waveform signal having a rising time of approximately 2 nanoseconds to a connection portion of a transmission line for performing reception or transmission of a signal; and
detecting a state of the transmission line based on a reflected signal of the step waveform signal,
the step waveform signal being coupled to a multiple of waveform shaping circuits, at least one of the waveform shaping circuits comprising a dummy output resistance and a reference load, the values of the dummy output resistance and the reference load being selected to set a maximum margin for transmission line status detection.

15. A semiconductor integrated circuit comprising:
a connection portion of a transmission line for performing reception or transmission of a signal; and
a transmission-line state detection unit outputting a step waveform signal having a rising time of approximately 2 nanoseconds to the connection portion and detecting a state of the transmission line based on a reflected signal of the step waveform signal,
the step waveform signal being coupled to a multiple of waveform shaping circuits, at least one of the waveform shaping circuits comprising a dummy output resistance and a reference load, the values of the dummy output resistance and the reference load being selected to set a maximum margin for transmission line status detection.

16. The semiconductor integrated circuit according to claim 15,
wherein the transmission-line state detection unit detects connection/disconnection of the transmission line to the connection portion as the state of the transmission line, and the unit includes
a signal output unit outputting the step waveform signal to the connector through an output resistance having a resistance value corresponding to impedance of the transmission line,
a reference signal generation unit generating a comparison reference signal having a value obtained by attenuating the maximum value of the step waveform signal by a fixed attenuation rate,
a timing signal generation unit generating a timing signal at a point delayed from a rising point of the step waveform signal by a given period of time, and
a latched comparator obtaining a detection output by latching a comparison result between a signal obtained at the output side of the signal output unit and the comparison reference signal generated by the reference generation unit by the timing signal generated by the timing generation unit.

17. The semiconductor integrated circuit according to claim 15,
wherein the transmission-line state detection unit detects the length of the transmission line connected to the connection portion as the state of the transmission line, and the unit includes
a signal output unit outputting the step waveform signal to the connector through an output resistance having a resistance value corresponding to impedance of the transmission line,
a reference signal generation unit generating a comparison reference signal having a value obtained by attenuating the maximum value of the step waveform signal by a fixed attenuation rate,
a timing signal generation unit generating a timing signal at a point delayed from a rising point of the step waveform signal by a given period of time,
a latched comparator latching a comparison result between a signal obtained at the output side of the signal output unit and the comparison reference signal generated by the reference generation unit by the timing signal generated by the timing generation unit, and
a control unit extending the given period of time in the timing signal generation unit in stages or shortening the given period of time in stages until an output of the latched comparator changes from one state to another state as well as generating the step waveform signal in each stage.

18. The semiconductor integrated circuit according to claim 15,
wherein the transmission-line state detection unit detects impedance of the transmission line connected to the connection portion as the state of the transmission line, and the unit includes
a signal output unit outputting the step waveform signal to the connector through an output resistance,
a reference signal generation unit generating a comparison reference signal having a value obtained by attenuating the maximum value of the divided step waveform signal by a fixed attenuation rate,
a timing signal generation unit generating a timing signal at a point delayed from a rising point of the step waveform signal by a given period of time,
a latched comparator latching a comparison result between a signal obtained at the output side of the signal output unit and the comparison reference signal generated by the reference generation unit by the timing signal generated by the timing generation unit, and
a control unit increasing a resistance value of the output resistance in the signal output unit in stages or reducing the resistance value in stages until an output of the latched comparator changes from one state to another state as well as generating the step waveform signal in each stage.

* * * * *